United States Patent
Li et al.

(10) Patent No.: US 6,916,717 B2
(45) Date of Patent: Jul. 12, 2005

(54) METHOD FOR GROWING A MONOCRYSTALLINE OXIDE LAYER AND FOR FABRICATING A SEMICONDUCTOR DEVICE ON A MONOCRYSTALLINE SUBSTRATE

(75) Inventors: Hao Li, Chandler, AZ (US); Ravindranath Droopad, Chandler, AZ (US); Daniel S. Marshall, Chandler, AZ (US); Yi Wei, Chandler, AZ (US); Xiao M. Hu, Gilbert, AZ (US); Yong Liang, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 50 days.

(21) Appl. No.: 10/137,383

(22) Filed: May 3, 2002

(65) Prior Publication Data
US 2003/0207589 A1 Nov. 6, 2003

(51) Int. Cl.[7] .............................................. H01L 21/336
(52) U.S. Cl. ..................... 438/287; 438/591; 257/410
(58) Field of Search ................................ 438/287, 591; 257/410

(56) References Cited

U.S. PATENT DOCUMENTS

| | | |
|---|---|---|
| 3,617,951 A | 11/1971 | Anderson |
| 3,670,213 A | 6/1972 | Nakagawa et al. |
| 3,758,199 A | 9/1973 | Thaxter |
| 3,766,370 A | 10/1973 | Walther |
| 3,802,967 A | 4/1974 | Ladany et al. |
| 3,818,451 A | 6/1974 | Coleman |
| 3,914,137 A | 10/1975 | Huffman et al. |
| 3,935,031 A | 1/1976 | Adler |
| 4,006,989 A | 2/1977 | Andringa |
| 4,084,130 A | 4/1978 | Holton |

(Continued)

FOREIGN PATENT DOCUMENTS

| | | |
|---|---|---|
| DE | 196 07 107 | 8/1997 |
| DE | 197 12 496 | 10/1997 |
| DE | 100 17 137 | 10/2000 |
| EP | 0 247 722 | 12/1987 |
| EP | 0 250 171 | 12/1987 |

(Continued)

OTHER PUBLICATIONS

Peter Weiss; "Speed demon gets hooked on silicon"; Science News Online; Sep. 15, 2001; pp. 1–3.

(Continued)

*Primary Examiner*—W. David Coleman
(74) *Attorney, Agent, or Firm*—Oblon, Spivak, McClelland, Maier & Neustadt, P.C.

(57) ABSTRACT

High quality monocrystalline metal oxide layers are grown on a monocrystalline substrate such as a silicon wafer. The monocrystalline metal oxide is grown on the silicon substrate at a temperature low enough to prevent deleterious and simultaneous oxidation of the silicon substrate. After a layer of 1–3 monolayers of the monocrystalline oxide is grown, the growth is stopped and the crystal quality of that layer is improved by a higher temperature anneal. Following the anneal, the thickness of the layer can be increased by restarting the low temperature growth. An amorphous silicon oxide layer can be grown at the interface between the monocrystalline metal oxide layer and the silicon substrate after the thickness of the monocrystalline oxide reaches a few monolayers.

25 Claims, 7 Drawing Sheets

U.S. PATENT DOCUMENTS

| | | |
|---|---|---|
| 4,120,588 A | 10/1978 | Chaum |
| 4,146,297 A | 3/1979 | Alferness et al. |
| 4,174,422 A | 11/1979 | Matthews et al. |
| 4,174,504 A | 11/1979 | Chenausky et al. |
| 4,177,094 A | 12/1979 | Kroon |
| 4,242,595 A | 12/1980 | Lehovec |
| 4,284,329 A | 8/1981 | Smith et al. |
| 4,289,920 A | 9/1981 | Hovel |
| 4,297,656 A | 10/1981 | Pan |
| 4,298,247 A | 11/1981 | Michelet et al. |
| 4,378,259 A | 3/1983 | Hasegawa et al. |
| 4,392,297 A | 7/1983 | Little |
| 4,398,342 A | 8/1983 | Pitt et al. |
| 4,404,265 A | 9/1983 | Manasevit |
| 4,424,589 A | 1/1984 | Thomas et al. |
| 4,439,014 A | 3/1984 | Stacy et al. |
| 4,442,590 A | 4/1984 | Stockton et al. |
| 4,447,116 A | 5/1984 | King et al. |
| 4,452,720 A | 6/1984 | Harada et al. |
| 4,459,325 A | 7/1984 | Nozawa et al. |
| 4,482,422 A | 11/1984 | McGinn et al. |
| 4,482,906 A | 11/1984 | Hovel et al. |
| 4,484,332 A | 11/1984 | Hawrylo |
| 4,503,540 A | 3/1985 | Nakashima et al. |
| 4,523,211 A | 6/1985 | Morimoto et al. |
| 4,525,871 A | 6/1985 | Foyt et al. |
| 4,594,000 A | 6/1986 | Falk et al. |
| 4,626,878 A | 12/1986 | Kuwano et al. |
| 4,629,821 A | 12/1986 | Bronstein-Bonte et al. |
| 4,661,176 A | 4/1987 | Manasevit |
| 4,667,088 A | 5/1987 | Kramer et al. |
| 4,667,212 A | 5/1987 | Nakamura |
| 4,681,982 A | 7/1987 | Yoshida |
| 4,695,120 A | 9/1987 | Holder |
| 4,723,321 A | 2/1988 | Saleh |
| 4,748,485 A | 5/1988 | Vasudev |
| 4,756,007 A | 7/1988 | Qureshi et al. |
| 4,772,929 A | 9/1988 | Manchester et al. |
| 4,773,063 A | 9/1988 | Hunsperger et al. |
| 4,774,205 A | 9/1988 | Choi et al. |
| 4,777,613 A | 10/1988 | Shahan et al. |
| 4,793,872 A | 12/1988 | Meunier et al. |
| 4,801,184 A | 1/1989 | Revelli |
| 4,802,182 A | 1/1989 | Thornton et al. |
| 4,804,866 A | 2/1989 | Akiyama |
| 4,815,084 A | 3/1989 | Scifres et al. |
| 4,841,775 A | 6/1989 | Ikeda et al. |
| 4,843,609 A | 6/1989 | Ohya et al. |
| 4,845,044 A | 7/1989 | Ariyoshi et al. |
| 4,846,926 A | 7/1989 | Kay et al. |
| 4,855,249 A | 8/1989 | Akasaki et al. |
| 4,866,489 A | 9/1989 | Yokogawa et al. |
| 4,868,376 A | 9/1989 | Lessin et al. |
| 4,872,046 A | 10/1989 | Morkoc et al. |
| 4,876,208 A | 10/1989 | Gustafson et al. |
| 4,876,218 A | 10/1989 | Pessa et al. |
| 4,876,219 A | 10/1989 | Eshita et al. |
| 4,882,300 A | 11/1989 | Inoue et al. |
| 4,885,376 A | 12/1989 | Verkade |
| 4,888,202 A | 12/1989 | Murakami et al. |
| 4,889,402 A | 12/1989 | Reinhart |
| 4,891,091 A | 1/1990 | Shastry |
| 4,896,194 A | 1/1990 | Suzuki |
| 4,901,133 A | 2/1990 | Curran et al. |
| 4,910,164 A | 3/1990 | Shichijo |
| 4,912,087 A | 3/1990 | Aslam et al. |
| 4,928,154 A | 5/1990 | Umeno et al. |
| 4,934,777 A | 6/1990 | Jou et al. |
| 4,952,420 A | 8/1990 | Walters |
| 4,959,702 A | 9/1990 | Moyer et al. |
| 4,963,508 A | 10/1990 | Umeno et al. |
| 4,963,949 A | 10/1990 | Wanlass et al. |
| 4,965,649 A | 10/1990 | Zanio et al. |
| 4,981,714 A | 1/1991 | Ohno et al. |
| 4,984,043 A | 1/1991 | Vinal |
| 4,999,842 A | 3/1991 | Huang et al. |
| 5,018,816 A | 5/1991 | Murray et al. |
| 5,028,563 A | 7/1991 | Feit et al. |
| 5,028,976 A | 7/1991 | Ozaki et al. |
| 5,051,790 A | 9/1991 | Hammer |
| 5,053,835 A | 10/1991 | Horikawa et al. |
| 5,055,445 A | 10/1991 | Belt et al. |
| 5,055,835 A | 10/1991 | Sutton |
| 5,057,694 A | 10/1991 | Idaka et al. |
| 5,060,031 A | 10/1991 | Abrokwah et al. |
| 5,063,081 A | 11/1991 | Cozzette et al. |
| 5,063,166 A | 11/1991 | Mooney et al. |
| 5,067,809 A | 11/1991 | Tsubota |
| 5,073,981 A | 12/1991 | Giles et al. |
| 5,075,743 A | 12/1991 | Behfar-Rad |
| 5,081,062 A | 1/1992 | Vasudev et al. |
| 5,081,519 A | 1/1992 | Nishimura et al. |
| 5,087,829 A | 2/1992 | Ishibashi et al. |
| 5,103,494 A | 4/1992 | Mozer |
| 5,116,461 A | 5/1992 | Lebby et al. |
| 5,119,448 A | 6/1992 | Schaefer et al. |
| 5,122,852 A | 6/1992 | Chan et al. |
| 5,127,067 A | 6/1992 | Delcoco et al. |
| 5,130,762 A | 7/1992 | Kulick |
| 5,132,648 A | 7/1992 | Trinh et al. |
| 5,140,387 A | 8/1992 | Okazaki et al. |
| 5,140,651 A | 8/1992 | Soref et al. |
| 5,141,894 A | 8/1992 | Bisaro et al. |
| 5,143,854 A | 9/1992 | Pirrung et al. |
| 5,144,409 A | 9/1992 | Ma |
| 5,148,504 A | 9/1992 | Levi et al. |
| 5,155,658 A | 10/1992 | Inam et al. |
| 5,159,413 A | 10/1992 | Calviello et al. |
| 5,163,118 A | 11/1992 | Lorenzo et al. |
| 5,166,761 A | 11/1992 | Olson et al. |
| 5,173,474 A | 12/1992 | Connell et al. |
| 5,173,835 A | 12/1992 | Cornett et al. |
| 5,181,085 A | 1/1993 | Moon et al. |
| 5,185,589 A | 2/1993 | Krishnaswamy et al. |
| 5,188,976 A | 2/1993 | Kume et al. |
| 5,191,625 A | 3/1993 | Gustavsson |
| 5,194,397 A | 3/1993 | Cook et al. |
| 5,194,917 A | 3/1993 | Regener |
| 5,198,269 A | 3/1993 | Swartz et al. |
| 5,208,182 A | 5/1993 | Narayan et al. |
| 5,210,763 A | 5/1993 | Lewis et al. |
| 5,216,359 A | 6/1993 | Makki et al. |
| 5,216,729 A | 6/1993 | Berger et al. |
| 5,221,367 A | 6/1993 | Chisholm et al. |
| 5,225,031 A | 7/1993 | McKee et al. |
| 5,227,196 A | 7/1993 | Itoh |
| 5,238,877 A | 8/1993 | Russell |
| 5,244,818 A | 9/1993 | Jokers et al. |
| 5,248,564 A | 9/1993 | Ramesh |
| 5,260,394 A | 11/1993 | Tazaki et al. |
| 5,262,659 A | 11/1993 | Grudkowski et al. |
| 5,266,355 A | 11/1993 | Wernberg et al. |
| 5,268,327 A | 12/1993 | Vernon |
| 5,270,298 A | 12/1993 | Ramesh |
| 5,280,013 A | 1/1994 | Newman et al. |
| 5,281,834 A | 1/1994 | Cambou et al. |
| 5,283,462 A | 2/1994 | Stengel |
| 5,286,985 A | 2/1994 | Taddiken |
| 5,293,050 A | 3/1994 | Chapple-Sokol et al. |
| 5,306,649 A | 4/1994 | Hebert |
| 5,310,707 A | 5/1994 | Oishi et al. |

| Patent No. | Date | Inventor(s) |
|---|---|---|
| 5,312,765 A | 5/1994 | Kanber |
| 5,313,058 A | 5/1994 | Friederich et al. |
| 5,314,547 A | 5/1994 | Heremans et al. |
| 5,315,128 A | 5/1994 | Hunt et al. |
| 5,323,023 A | 6/1994 | Fork |
| 5,326,721 A | 7/1994 | Summerfelt |
| 5,334,556 A | 8/1994 | Guldi |
| 5,352,926 A | 10/1994 | Andrews |
| 5,356,509 A | 10/1994 | Terranova et al. |
| 5,356,831 A | 10/1994 | Calviello et al. |
| 5,357,122 A | 10/1994 | Okubora et al. |
| 5,358,925 A | 10/1994 | Neville Connell et al. |
| 5,362,972 A | 11/1994 | Yazawa et al. |
| 5,362,998 A | 11/1994 | Iwamura et al. |
| 5,365,477 A | 11/1994 | Cooper, Jr. et al. |
| 5,371,621 A | 12/1994 | Stevens |
| 5,371,734 A | 12/1994 | Fischer |
| 5,372,992 A | 12/1994 | Itozaki et al. |
| 5,373,166 A | 12/1994 | Buchan et al. |
| 5,387,811 A | 2/1995 | Saigoh |
| 5,391,515 A | 2/1995 | Kao et al. |
| 5,393,352 A | 2/1995 | Summerfelt |
| 5,394,489 A | 2/1995 | Koch |
| 5,395,663 A | 3/1995 | Tabata et al. |
| 5,397,428 A | 3/1995 | Stoner et al. |
| 5,399,898 A | 3/1995 | Rostoker |
| 5,404,581 A | 4/1995 | Honjo |
| 5,405,802 A | 4/1995 | Yamagata et al. |
| 5,406,202 A | 4/1995 | Mehrgardt et al. |
| 5,410,622 A | 4/1995 | Okada et al. |
| 5,418,216 A | 5/1995 | Fork |
| 5,418,389 A | 5/1995 | Watanabe |
| 5,420,102 A | 5/1995 | Harshavardhan et al. |
| 5,427,988 A | 6/1995 | Sengupta et al. |
| 5,436,759 A | 7/1995 | Dijail et al. |
| 5,438,584 A | 8/1995 | Paoli et al. |
| 5,441,577 A | 8/1995 | Sasaki et al. |
| 5,442,191 A | 8/1995 | Ma |
| 5,442,561 A | 8/1995 | Yoshizawa et al. |
| 5,444,016 A | 8/1995 | Abrokwah et al. |
| 5,446,719 A | 8/1995 | Yoshida et al. |
| 5,450,812 A | 9/1995 | McKee et al. |
| 5,452,118 A | 9/1995 | Maruska |
| 5,453,727 A | 9/1995 | Shibasaki et al. |
| 5,466,631 A | 11/1995 | Ichikawa et al. |
| 5,473,047 A | 12/1995 | Shi |
| 5,473,171 A | 12/1995 | Summerfelt |
| 5,477,363 A | 12/1995 | Matsuda |
| 5,478,653 A | 12/1995 | Guenzer |
| 5,479,033 A | 12/1995 | Baca et al. |
| 5,479,317 A | 12/1995 | Ramesh |
| 5,480,829 A | 1/1996 | Abrokwah et al. |
| 5,481,102 A | 1/1996 | Hazelrigg, Jr. |
| 5,482,003 A | 1/1996 | McKee et al. |
| 5,484,664 A | 1/1996 | Kitahara et al. |
| 5,486,406 A | 1/1996 | Shi |
| 5,491,461 A | 2/1996 | Partin et al. |
| 5,492,859 A | 2/1996 | Sakaguchi et al. |
| 5,494,711 A | 2/1996 | Takeda et al. |
| 5,504,035 A | 4/1996 | Rostoker et al. |
| 5,504,183 A | 4/1996 | Shi |
| 5,508,554 A | 4/1996 | Takatani et al. |
| 5,510,665 A | 4/1996 | Conley |
| 5,511,238 A | 4/1996 | Bayraktaroglu |
| 5,512,773 A | 4/1996 | Wolf et al. |
| 5,514,484 A | 5/1996 | Nashimoto |
| 5,514,904 A | 5/1996 | Onga et al. |
| 5,515,047 A | 5/1996 | Yamakido et al. |
| 5,515,810 A | 5/1996 | Yamashita |
| 5,516,725 A | 5/1996 | Chang et al. |
| 5,519,235 A | 5/1996 | Ramesh |
| 5,523,602 A | 6/1996 | Horiuchi et al. |
| 5,528,057 A | 6/1996 | Yanagase et al. |
| 5,528,067 A | 6/1996 | Farb |
| 5,528,209 A | 6/1996 | Macdonald et al. |
| 5,528,414 A | 6/1996 | Oakley |
| 5,530,235 A | 6/1996 | Stefik et al. |
| 5,538,941 A | 7/1996 | Findikoglu et al. |
| 5,540,785 A | 7/1996 | Dennard et al. |
| 5,541,422 A | 7/1996 | Wolf et al. |
| 5,548,141 A | 8/1996 | Morris et al. |
| 5,549,977 A | 8/1996 | Jin et al. |
| 5,551,238 A | 9/1996 | Prueitt |
| 5,552,547 A | 9/1996 | Shi |
| 5,556,463 A | 9/1996 | Guenzer |
| 5,559,368 A | 9/1996 | Hu et al. |
| 5,561,305 A | 10/1996 | Smith |
| 5,569,953 A | 10/1996 | Kikkawa et al. |
| 5,570,226 A | 10/1996 | Ota |
| 5,572,052 A | 11/1996 | Kashihara et al. |
| 5,574,296 A | 11/1996 | Park et al. |
| 5,574,589 A | 11/1996 | Feuer et al. |
| 5,574,744 A | 11/1996 | Gaw et al. |
| 5,576,879 A | 11/1996 | Nashimoto |
| 5,578,162 A | 11/1996 | D'Asaro et al. |
| 5,585,167 A | 12/1996 | Satoh et al. |
| 5,585,288 A | 12/1996 | Davis et al. |
| 5,588,995 A | 12/1996 | Sheldon |
| 5,589,284 A | 12/1996 | Summerfelt et al. |
| 5,593,069 A | 1/1997 | Seki et al. |
| 5,596,205 A | 1/1997 | Reedy et al. |
| 5,596,214 A | 1/1997 | Endo |
| 5,602,418 A | 2/1997 | Imai et al. |
| 5,603,764 A | 2/1997 | Matsuda et al. |
| 5,606,184 A | 2/1997 | Abrokwah et al. |
| 5,608,046 A | 3/1997 | Cook et al. |
| 5,610,744 A | 3/1997 | Ho et al. |
| 5,614,739 A | 3/1997 | Abrokwah et al. |
| 5,619,051 A | 4/1997 | Endo |
| 5,621,227 A | 4/1997 | Joshi |
| 5,623,439 A | 4/1997 | Gotoh et al. |
| 5,623,552 A | 4/1997 | Lane |
| 5,629,534 A | 5/1997 | Inuzuka et al. |
| 5,633,724 A | 5/1997 | King et al. |
| 5,635,433 A | 6/1997 | Sengupta |
| 5,635,453 A | 6/1997 | Pique et al. |
| 5,640,267 A | 6/1997 | May et al. |
| 5,642,371 A | 6/1997 | Tohyama et al. |
| 5,650,646 A | 7/1997 | Summerfelt |
| 5,656,382 A | 8/1997 | Nashimoto |
| 5,659,180 A | 8/1997 | Shen et al. |
| 5,661,112 A | 8/1997 | Hatta et al. |
| 5,666,376 A | 9/1997 | Cheng |
| 5,667,586 A | 9/1997 | Ek et al. |
| 5,668,048 A | 9/1997 | Kondo et al. |
| 5,670,798 A | 9/1997 | Schetzina |
| 5,670,800 A | 9/1997 | Nakao et al. |
| 5,674,366 A | 10/1997 | Hayashi et al. |
| 5,674,813 A | 10/1997 | Nakamura et al. |
| 5,679,947 A | 10/1997 | Doi et al. |
| 5,679,965 A | 10/1997 | Schetzina |
| 5,682,046 A | 10/1997 | Takahashi et al. |
| 5,684,302 A | 11/1997 | Wersing et al. |
| 5,686,741 A | 11/1997 | Ohori et al. |
| 5,689,123 A | 11/1997 | Major et al. |
| 5,693,140 A | 12/1997 | McKee et al. |
| 5,719,417 A | 2/1998 | Roeder et al. |
| 5,725,641 A | 3/1998 | MacLeod |
| 5,729,394 A | 3/1998 | Sevier et al. |
| 5,729,641 A | 3/1998 | Chandonnet et al. |
| 5,731,220 A | 3/1998 | Tsu et al. |
| 5,733,641 A | 3/1998 | Fork et al. |

| | | | | | |
|---|---|---|---|---|---|
| 5,734,672 A | 3/1998 | McMinn et al. | 5,919,522 A | 7/1999 | Baum et al. |
| 5,735,949 A | 4/1998 | Mantl et al. | 5,926,493 A | 7/1999 | O'Brien et al. |
| 5,741,724 A | 4/1998 | Ramdani et al. | 5,926,496 A | 7/1999 | Ho et al. |
| 5,745,631 A | 4/1998 | Reinker | 5,937,115 A | 8/1999 | Domash |
| 5,753,300 A | 5/1998 | Wessels et al. | 5,937,274 A | 8/1999 | Kondow et al. |
| 5,753,928 A | 5/1998 | Krause | 5,937,285 A | 8/1999 | Abrokwah et al. |
| 5,753,934 A | 5/1998 | Yano et al. | 5,948,161 A | 9/1999 | Kizuki |
| 5,754,319 A | 5/1998 | Van De Voorde et al. | 5,953,468 A | 9/1999 | Finnila et al. |
| 5,754,714 A | 5/1998 | Suzuki et al. | 5,955,591 A | 9/1999 | Imbach et al. |
| 5,760,426 A | 6/1998 | Marx et al. | 5,959,308 A | 9/1999 | Shichijo et al. |
| 5,760,427 A | 6/1998 | Onda | 5,959,879 A | 9/1999 | Koo |
| 5,760,740 A | 6/1998 | Blodgett | 5,962,069 A | 10/1999 | Schindler et al. |
| 5,764,676 A | 6/1998 | Paoli et al. | 5,963,291 A | 10/1999 | Wu et al. |
| 5,767,543 A | 6/1998 | Ooms et al. | 5,966,323 A | 10/1999 | Chen et al. |
| 5,770,887 A | 6/1998 | Tadatomo et al. | 5,976,953 A | 11/1999 | Zavracky et al. |
| 5,772,758 A | 6/1998 | Collins et al. | 5,977,567 A | 11/1999 | Verdiell |
| 5,776,359 A | 7/1998 | Schultz et al. | 5,981,400 A | 11/1999 | Lo |
| 5,776,621 A | 7/1998 | Nashimoto | 5,981,976 A | 11/1999 | Murasato |
| 5,777,350 A | 7/1998 | Nakamura et al. | 5,981,980 A | 11/1999 | Miyajima et al. |
| 5,777,762 A | 7/1998 | Yamamoto | 5,984,190 A | 11/1999 | Nevill |
| 5,778,018 A | 7/1998 | Yoshikawa et al. | 5,985,404 A | 11/1999 | Yano et al. |
| 5,778,116 A | 7/1998 | Tomich | 5,987,011 A | 11/1999 | Toh |
| 5,780,311 A | 7/1998 | Beasom et al. | 5,987,196 A | 11/1999 | Noble |
| 5,789,733 A | 8/1998 | Jachimowicz et al. | 5,990,495 A | 11/1999 | Ohba |
| 5,789,845 A | 8/1998 | Wadaka et al. | 5,995,359 A | 11/1999 | Klee et al. |
| 5,790,583 A | 8/1998 | Ho | 5,995,528 A | 11/1999 | Fukunaga et al. |
| 5,792,569 A | 8/1998 | Sun et al. | 5,997,638 A | 12/1999 | Copel et al. |
| 5,792,679 A | 8/1998 | Nakato | 5,998,781 A | 12/1999 | Vawter et al. |
| 5,796,648 A | 8/1998 | Kawakubo et al. | 5,998,819 A | 12/1999 | Yokoyama et al. |
| 5,801,072 A | 9/1998 | Barber | 6,002,375 A | 12/1999 | Corman et al. |
| 5,801,105 A | 9/1998 | Yano et al. | 6,008,762 A | 12/1999 | Nghiem |
| 5,807,440 A | 9/1998 | Kubota et al. | 6,011,641 A | 1/2000 | Shin et al. |
| 5,810,923 A | 9/1998 | Yano et al. | 6,011,646 A | 1/2000 | Mirkarimi et al. |
| 5,812,272 A | 9/1998 | King et al. | 6,013,553 A | 1/2000 | Wallace et al. |
| 5,814,583 A | 9/1998 | Itozaki et al. | 6,020,222 A | 2/2000 | Wollesen |
| 5,825,055 A | 10/1998 | Summerfelt | 6,022,140 A | 2/2000 | Fraden et al. |
| 5,825,799 A | 10/1998 | Ho et al. | 6,022,410 A | 2/2000 | Yu et al. |
| 5,827,755 A | 10/1998 | Yonehara et al. | 6,022,671 A | 2/2000 | Binkley et al. |
| 5,828,080 A | 10/1998 | Yano et al. | 6,022,963 A | 2/2000 | McGall et al. |
| 5,830,270 A | 11/1998 | McKee et al. | 6,023,082 A | 2/2000 | McKee et al. |
| 5,831,960 A | 11/1998 | Jiang et al. | 6,028,853 A | 2/2000 | Haartsen |
| 5,833,603 A | 11/1998 | Kovacs et al. | 6,039,803 A | 3/2000 | Fitzgerald et al. |
| 5,834,362 A | 11/1998 | Miyagaki et al. | 6,045,626 A | 4/2000 | Yano et al. |
| 5,838,035 A | 11/1998 | Ramesh | 6,046,464 A | 4/2000 | Schetzina |
| 5,838,053 A | 11/1998 | Bevan et al. | 6,048,751 A | 4/2000 | D'Asaro et al. |
| 5,844,260 A | 12/1998 | Ohori | 6,049,110 A | 4/2000 | Koh |
| 5,846,846 A | 12/1998 | Suh et al. | 6,049,702 A | 4/2000 | Tham et al. |
| 5,852,687 A | 12/1998 | Wickham | 6,051,858 A | 4/2000 | Uchida et al. |
| 5,857,049 A | 1/1999 | Beranek et al. | 6,051,874 A | 4/2000 | Masuda |
| 5,858,814 A | 1/1999 | Goossen et al. | 6,055,179 A | 4/2000 | Koganei et al. |
| 5,861,966 A | 1/1999 | Ortel | 6,058,131 A | 5/2000 | Pan |
| 5,863,326 A | 1/1999 | Nause et al. | 6,059,895 A | 5/2000 | Chu et al. |
| 5,864,171 A | 1/1999 | Yamamoto et al. | 6,064,078 A | 5/2000 | Northrup et al. |
| 5,869,845 A | 2/1999 | Vander Wagt et al. | 6,064,092 A | 5/2000 | Park |
| 5,872,493 A | 2/1999 | Ella | 6,064,783 A | 5/2000 | Congdon et al. |
| 5,873,977 A | 2/1999 | Desu et al. | 6,078,717 A | 6/2000 | Nashimoto et al. |
| 5,874,860 A | 2/1999 | Brunel et al. | 6,080,378 A | 6/2000 | Yokota et al. |
| 5,878,175 A | 3/1999 | Sonoda et al. | 6,083,697 A | 7/2000 | Beecher et al. |
| 5,879,956 A | 3/1999 | Seon et al. | 6,087,681 A | 7/2000 | Shakuda |
| 5,880,452 A | 3/1999 | Plesko | 6,088,216 A | 7/2000 | Laibowitz et al. |
| 5,882,948 A | 3/1999 | Jewell | 6,090,659 A | 7/2000 | Laibowitz et al. |
| 5,883,564 A | 3/1999 | Partin | 6,093,302 A | 7/2000 | Montgomery |
| 5,883,996 A | 3/1999 | Knapp et al. | 6,096,584 A | 8/2000 | Ellis-Monaghan et al. |
| 5,886,867 A | 3/1999 | Chivukula et al. | 6,100,578 A | 8/2000 | Suzuki |
| 5,888,296 A | 3/1999 | Ooms et al. | 6,103,008 A | 8/2000 | McKee et al. |
| 5,889,296 A | 3/1999 | Imamura et al. | 6,103,403 A | 8/2000 | Grigorian et al. |
| 5,896,476 A | 4/1999 | Wisseman et al. | 6,107,653 A | 8/2000 | Fitzgerald |
| 5,905,571 A | 5/1999 | Butler et al. | 6,107,721 A | 8/2000 | Lakin |
| 5,907,792 A | 5/1999 | Droopad et al. | 6,108,125 A | 8/2000 | Yano |
| 5,912,068 A | 6/1999 | Jia | 6,110,813 A | 8/2000 | Ota et al. |
| 5,919,515 A * | 7/1999 | Yano et al. .............. 427/126.3 | 6,110,840 A | 8/2000 | Yu |

| | | |
|---|---|---|
| 6,113,225 A | 9/2000 | Miyata et al. |
| 6,113,690 A | 9/2000 | Yu et al. |
| 6,114,996 A | 9/2000 | Nghiem |
| 6,121,642 A | 9/2000 | Newns |
| 6,121,647 A | 9/2000 | Yano et al. |
| 6,128,178 A | 10/2000 | Newns |
| 6,134,114 A | 10/2000 | Ungermann et al. |
| 6,136,666 A | 10/2000 | So |
| 6,137,603 A | 10/2000 | Henmi |
| 6,139,483 A | 10/2000 | Seabaugh et al. |
| 6,140,746 A | 10/2000 | Miyashita et al. |
| 6,143,072 A | 11/2000 | McKee et al. |
| 6,143,366 A | 11/2000 | Lu |
| 6,146,906 A | 11/2000 | Inoue et al. |
| 6,150,239 A | 11/2000 | Goesele et al. |
| 6,153,010 A | 11/2000 | Kiyoku et al. |
| 6,153,454 A | 11/2000 | Krivokapic |
| 6,156,581 A | 12/2000 | Vaudo et al. |
| 6,173,474 B1 | 1/2001 | Conrad |
| 6,174,755 B1 | 1/2001 | Manning |
| 6,175,497 B1 | 1/2001 | Tseng et al. |
| 6,175,555 B1 | 1/2001 | Hoole |
| 6,180,252 B1 | 1/2001 | Farrell et al. |
| 6,180,486 B1 | 1/2001 | Leobandung et al. |
| 6,181,920 B1 | 1/2001 | Dent et al. |
| 6,184,044 B1 | 2/2001 | Sone et al. |
| 6,184,144 B1 | 2/2001 | Lo |
| 6,191,011 B1 | 2/2001 | Gilboa et al. |
| 6,194,753 B1 | 2/2001 | Seon et al. |
| 6,197,503 B1 | 3/2001 | Vo-Dinh et al. |
| 6,198,119 B1 | 3/2001 | Nabatame et al. |
| 6,204,525 B1 | 3/2001 | Sakurai et al. |
| 6,204,737 B1 | 3/2001 | Ella |
| 6,208,453 B1 | 3/2001 | Wessels et al. |
| 6,210,988 B1 | 4/2001 | Howe et al. |
| 6,211,096 B1 | 4/2001 | Allman et al. |
| 6,222,654 B1 | 4/2001 | Frigo |
| 6,224,669 B1 | 5/2001 | Yi et al. |
| 6,225,051 B1 | 5/2001 | Sugiyama et al. |
| 6,229,159 B1 | 5/2001 | Suzuki |
| 6,232,242 B1 | 5/2001 | Hata et al. |
| 6,232,910 B1 | 5/2001 | Bell et al. |
| 6,233,435 B1 | 5/2001 | Wong |
| 6,235,145 B1 | 5/2001 | Li et al. |
| 6,238,946 B1 | 5/2001 | Ziegler |
| 6,239,012 B1 | 5/2001 | Kinsman |
| 6,239,449 B1 | 5/2001 | Fafard et al. |
| 6,241,821 B1 | 6/2001 | Yu et al. |
| 6,242,686 B1 | 6/2001 | Kishimoto et al. |
| 6,248,459 B1 | 6/2001 | Wang et al. |
| 6,248,621 B1 | 6/2001 | Wilk et al. |
| 6,252,261 B1 | 6/2001 | Usui et al. |
| 6,253,649 B1 | 7/2001 | Shinjo |
| 6,255,198 B1 | 7/2001 | Linthicum et al. |
| 6,256,426 B1 | 7/2001 | Duchet |
| 6,265,749 B1 | 7/2001 | Gardner et al. |
| 6,268,269 B1 | 7/2001 | Lee et al. |
| 6,271,619 B1 | 8/2001 | Yamada et al. |
| 6,275,122 B1 | 8/2001 | Speidell et al. |
| 6,277,436 B1 | 8/2001 | Stauf et al. |
| 6,278,137 B1 | 8/2001 | Shimoyama et al. |
| 6,278,138 B1 | 8/2001 | Suzuki |
| 6,278,523 B1 | 8/2001 | Gorecki |
| 6,278,541 B1 | 8/2001 | Baker |
| 6,291,319 B1 | 9/2001 | Yu et al. |
| 6,291,866 B1 | 9/2001 | Wallace |
| 6,297,598 B1 | 10/2001 | Wang et al. |
| 6,297,842 B1 | 10/2001 | Koizumi et al. |
| 6,300,615 B1 | 10/2001 | Shinohara et al. |
| 6,306,668 B1 | 10/2001 | McKee et al. |
| 6,307,996 B1 | 10/2001 | Nashimoto et al. |
| 6,312,819 B1 | 11/2001 | Jia et al. |
| 6,313,486 B1 | 11/2001 | Kencke et al. |
| 6,316,785 B1 | 11/2001 | Nunoue et al. |
| 6,316,832 B1 | 11/2001 | Tsuzuki et al. |
| 6,319,730 B1 | 11/2001 | Ramdani et al. |
| 6,320,238 B1 | 11/2001 | Kizilyalli et al. |
| 6,326,637 B1 | 12/2001 | Parkin et al. |
| 6,326,645 B1 | 12/2001 | Kadota |
| 6,326,667 B1 | 12/2001 | Sugiyama et al. |
| 6,338,756 B2 | 1/2002 | Dietze |
| 6,339,664 B1 | 1/2002 | Farjady et al. |
| 6,340,788 B1 | 1/2002 | King et al. |
| 6,341,851 B1 | 1/2002 | Takayama et al. |
| 6,343,171 B1 | 1/2002 | Yoshimura et al. |
| 6,345,424 B1 | 2/2002 | Hasegawa et al. |
| 6,348,373 B1 | 2/2002 | Ma et al. |
| 6,355,945 B1 | 3/2002 | Kadota et al. |
| 6,359,330 B1 | 3/2002 | Goudard |
| 6,362,017 B1 | 3/2002 | Manabe et al. |
| 6,362,558 B1 | 3/2002 | Fukui |
| 6,367,699 B2 | 4/2002 | Ackley |
| 6,372,356 B1 | 4/2002 | Thornton et al. |
| 6,372,813 B1 | 4/2002 | Johnson et al. |
| 6,376,337 B1 | 4/2002 | Wang et al. |
| 6,389,209 B1 | 5/2002 | Suhir |
| 6,391,674 B2 | 5/2002 | Ziegler |
| 6,392,253 B1 | 5/2002 | Saxena |
| 6,392,257 B1 | 5/2002 | Ramdani et al. |
| 6,393,167 B1 | 5/2002 | Davis et al. |
| 6,404,027 B1 * | 6/2002 | Hong et al. .................. 257/410 |
| 6,410,941 B1 | 6/2002 | Taylor et al. |
| 6,410,947 B1 | 6/2002 | Wada |
| 6,411,756 B2 | 6/2002 | Sadot et al. |
| 6,415,140 B1 | 7/2002 | Benjamin et al. |
| 6,417,059 B2 | 7/2002 | Huang |
| 6,419,849 B1 | 7/2002 | Qiu et al. |
| 6,427,066 B1 | 7/2002 | Grube |
| 6,432,546 B1 | 8/2002 | Ramesh et al. |
| 6,438,281 B1 | 8/2002 | Tsukamoto et al. |
| 6,445,724 B2 | 9/2002 | Abeles |
| 6,452,232 B1 | 9/2002 | Adan |
| 6,461,927 B1 | 10/2002 | Mochizuki et al. |
| 6,462,360 B1 | 10/2002 | Higgins, Jr. et al. |
| 6,477,285 B1 | 11/2002 | Shanley |
| 6,496,469 B1 | 12/2002 | Uchizaki |
| 6,498,358 B1 | 12/2002 | Lach et al. |
| 6,501,121 B1 * | 12/2002 | Yu et al. ..................... 257/310 |
| 6,504,189 B1 | 1/2003 | Matsuda et al. |
| 6,524,651 B2 | 2/2003 | Gan et al. |
| 6,538,359 B1 | 3/2003 | Hiraku et al. |
| 2001/0013313 A1 | 8/2001 | Droopad et al. |
| 2001/0020278 A1 | 9/2001 | Saito |
| 2001/0036142 A1 | 11/2001 | Kadowaki et al. |
| 2001/0055820 A1 | 12/2001 | Sakurai et al. |
| 2002/0006245 A1 | 1/2002 | Kubota et al. |
| 2002/0008234 A1 | 1/2002 | Emrick |
| 2002/0021855 A1 | 2/2002 | Kim |
| 2002/0030246 A1 | 3/2002 | Eisenberger et al. |
| 2002/0047123 A1 | 4/2002 | Ramdani et al. |
| 2002/0047143 A1 | 4/2002 | Ramdani et al. |
| 2002/0072245 A1 | 6/2002 | Ooms et al. |
| 2002/0076878 A1 | 6/2002 | Wasa et al. |
| 2002/0079578 A1 | 6/2002 | Seshan |
| 2002/0131675 A1 | 9/2002 | Litvin |
| 2002/0140012 A1 | 10/2002 | Droopad |
| 2002/0145168 A1 | 10/2002 | Bojarczuk, Jr. et al. |
| 2002/0179000 A1 | 12/2002 | Lee et al. |
| 2002/0195610 A1 | 12/2002 | Klosowlak |

FOREIGN PATENT DOCUMENTS

| | | |
|---|---|---|
| EP | 0 300 499 | 1/1989 |

| | | | | | |
|---|---|---|---|---|---|
| EP | 0 309 270 | 3/1989 | JP | 63-131104 | 6/1988 |
| EP | 0 331 338 | 9/1989 | JP | 63-198365 | 8/1988 |
| EP | 0 331 467 | 9/1989 | JP | 63-289812 | 11/1988 |
| EP | 0 342 937 | 11/1989 | JP | 64-50575 | 2/1989 |
| EP | 0 392 714 | 10/1990 | JP | 64-52329 | 2/1989 |
| EP | 0 412 002 | 2/1991 | JP | 1-102435 | 4/1989 |
| EP | 0 455 526 | 6/1991 | JP | 1-179411 | 7/1989 |
| EP | 0 483 993 | 5/1992 | JP | 01-196809 | 8/1989 |
| EP | 0 494 514 | 7/1992 | JP | 03-149882 | 11/1989 |
| EP | 0 514 018 | 11/1992 | JP | HEI 2-931 | 1/1990 |
| EP | 0 538 611 | 4/1993 | JP | 02051220 | 2/1990 |
| EP | 0 581 239 | 2/1994 | JP | 3-41783 | 2/1991 |
| EP | 0 600 668 | 6/1994 | JP | 03046384 | 2/1991 |
| EP | 0 602 568 | 6/1994 | JP | 3-171617 | 7/1991 |
| EP | 0 607 435 | 7/1994 | JP | 03-188619 | 8/1991 |
| EP | 0 614 256 | 9/1994 | JP | 5-48072 | 2/1993 |
| EP | 0 619 263 | 10/1994 | JP | 5-086477 | 4/1993 |
| EP | 0 630 057 | 12/1994 | JP | 05150143 | 6/1993 |
| EP | 0 661 561 | 7/1995 | JP | 05 221800 | 8/1993 |
| EP | 0 860 913 | 8/1995 | JP | 5-232307 | 9/1993 |
| EP | 0 682 266 | 11/1995 | JP | 5-238894 | 9/1993 |
| EP | 0 711 853 | 5/1996 | JP | 5-243525 | 9/1993 |
| EP | 0 884 767 | 12/1996 | JP | 5-291299 | 11/1993 |
| EP | 0 777 379 | 6/1997 | JP | 06-069490 | 3/1994 |
| EP | 0 810 666 | 12/1997 | JP | 6-334168 | 12/1994 |
| EP | 0 852 416 | 7/1998 | JP | 0812494 | 1/1996 |
| EP | 0 875 922 | 11/1998 | JP | 9-67193 | 3/1997 |
| EP | 0 861 669 | 12/1998 | JP | 9-82913 | 3/1997 |
| EP | 0 926 739 | 6/1999 | JP | 10-256154 | 9/1998 |
| EP | 0 957 522 | 11/1999 | JP | 10-269842 | 10/1998 |
| EP | 0 964 259 | 12/1999 | JP | 10-303396 | 11/1998 |
| EP | 0 964 453 | 12/1999 | JP | 10-321943 | 12/1998 |
| EP | 0 993 027 | 4/2000 | JP | 11135614 | 5/1999 |
| EP | 0 999 600 | 5/2000 | JP | 11-238683 | 8/1999 |
| EP | 1 001 468 | 5/2000 | JP | 11-260835 | 9/1999 |
| EP | 1 035 759 | 9/2000 | JP | 01 294594 | 11/1999 |
| EP | 1 037 272 | 9/2000 | JP | 11340542 | 12/1999 |
| EP | 1 043 426 | 10/2000 | JP | 2000-068466 | 3/2000 |
| EP | 1 043 427 | 10/2000 | JP | 2 000 1645 | 6/2000 |
| EP | 1 043 765 | 10/2000 | JP | 2000-278085 | 10/2000 |
| EP | 1 054 442 | 11/2000 | JP | 2000-349278 | 12/2000 |
| EP | 1 069 605 | 1/2001 | JP | 2000-351692 | 12/2000 |
| EP | 1 069 606 | 1/2001 | JP | 2001-196892 | 7/2001 |
| EP | 1 085 319 | 3/2001 | JP | 2002-9366 | 1/2002 |
| EP | 1 089 338 | 4/2001 | WO | WO 92/10875 | 6/1992 |
| EP | 1 109 212 | 6/2001 | WO | WO 93/07647 | 4/1993 |
| FR | 2 779 843 | 12/1999 | WO | WO 94/03908 | 2/1994 |
| GB | 1 319 311 | 6/1970 | WO | WO 97/45827 | 12/1997 |
| GB | 2 152 315 | 7/1985 | WO | WO 98/05807 | 1/1998 |
| GB | 2 335 792 | 9/1999 | WO | WO 98/20606 | 5/1998 |
| JP | 52-88354 | 7/1977 | WO | WO 99/14792 | 3/1999 |
| JP | 52-89070 | 7/1977 | WO | WO 99/14804 | 3/1999 |
| JP | 52-135684 | 11/1977 | WO | WO 99/19546 | 4/1999 |
| JP | 54-134554 | 10/1979 | WO | WO 99/63580 | 12/1999 |
| JP | 55-87424 | 7/1980 | WO | WO 00/06612 | 2/2000 |
| JP | 58-075868 | 5/1983 | WO | WO 00/16378 | 3/2000 |
| JP | 5-152529 | 6/1983 | WO | WO 00/33363 | 6/2000 |
| JP | 58-213412 | 12/1983 | WO | WO 00/48239 | 8/2000 |
| JP | 59-044004 | 3/1984 | WO | WO 01/04943 A1 | 1/2001 |
| JP | 59066183 | 4/1984 | WO | WO 01/16395 | 3/2001 |
| JP | 59-073498 | 4/1984 | WO | WO 01/33585 | 5/2001 |
| JP | 6-232126 | 8/1984 | WO | WO 01/37330 | 5/2001 |
| JP | 6-291299 | 10/1984 | WO | WO 01/59814 A2 | 8/2001 |
| JP | 60-161635 | 8/1985 | WO | WO 01/59820 A1 | 8/2001 |
| JP | 60-210018 | 10/1985 | WO | WO 01/59821 A1 | 8/2001 |
| JP | 60-212018 | 10/1985 | WO | WO 01/59837 | 8/2001 |
| JP | 61-36981 | 2/1986 | WO | WO 02 01648 | 1/2002 |
| JP | 61-63015 | 4/1986 | WO | WO 02/03113 | 1/2002 |
| JP | 61-108187 | 5/1986 | WO | WO 02/03467 | 1/2002 |
| JP | 62-245205 | 10/1987 | WO | WO 02/03480 | 1/2002 |
| JP | 63-34994 | 2/1988 | WO | WO 02/08806 | 1/2002 |

| | | |
|---|---|---|
| WO | WO 02/09160 A2 | 1/2002 |
| WO | WO 02/11254 | 2/2002 |
| WO | WO 02/33385 A2 | 4/2002 |
| WO | WO 02/47127 A2 | 6/2002 |
| WO | WO 02/50879 | 6/2002 |
| WO | WO 02/099885 | 12/2002 |
| WO | WO 03/012874 | 2/2003 |

OTHER PUBLICATIONS

"Motorola Develops New Super–Fast Chip"; USA Today; Sep. 4, 2001.

Lori Vallgra; "Motorola Lays GaAs on SI Wafer"; AsiaBiz Tech: Nov. 2001pp. 1–3.

"Holy Grail Motorola Claims High-Yield GaAs Breakthrough"; Micromagazine.com ; pp. 1–3; (no date available).

Jong–Gul Yoon; "Growth of Ferroelectric LINbO3 Thin Film on MgO–Buffered SI by the Sol–Gel Method"; Journal of the Korean Physical Society (Proc. Suppl.); vol. 29, Nov. 1998: pp. S648–S651.

V. Bornand et al.; "Deposition of LITaO3 thin films by pyrasol process"; Thin Solid Films 304 (1997); pp. 239–244.

R. Droopad et al.; "Development of high dielectric constant epitaxial oxides on silicon by molecular beam epitaxy"; Materials Science and Engineering B87 (2001); pp. 292–296.

A.K. Sharma et al.; "Integration of Pb(Zr0.52Ti0.48)O3 epilayers with SI by domain epitaxy"; Applied Physics Letters, vol. 76, No. 11; Mar. 13, 2000; pp. 1458–1460.

Dwight C. Streit et al; "High Reliability GaAs–AIGaAs HBT's by MBE with Be Base Doping and InGaAs Emitter Contacts"; 8179 Ieee Electron Device Letters; 12(1991) Sep., No. 9, New York, US.

C. Y. Hung et al; "Piezoelectrically Induced stress tuning of electro–optic devices"; 320 Applied Physics Letters; 59 Dec. 30, 1991 No. 27, New York, US.

J. Piprek; "Heat Flow Analysis of Long–Wvelength VCSELs with Various DBR Materials"; University of Deleware, Materials Science, Newark, DE, 19716–3106; Oct. 31, 1994; pp. 286–287.

P. Mackowiak et al.; "Some aspects of designing an efficient nitride VCSEL resonator"; J. Phys. D: Appl. Phys. 34(2001); pp. 954–958.

M.R. Wilson et al.; GaAs–On–Si: A GaAs IC Manufacturer's Perspective; GaAs IC Symposium, IEEE, 1988; pp. 243–246.

Y. Kitano et al.; "Thin film crystal growth of BaZrO3 at low oxygen partial pressure"; Journal of Crystal Growth 243 (2002): pp. 164–169.

M.E. Hawley; et al; "Microstructural Study of Colossal Magneto–Resistive Films As a Function of Growth Temperature, As Deposited and Annealed"; 401, 1996; pp. 531–536.

Charles Kittel: "Introduction to Solid State Physics"; John Wiley & Sons, Inc. Fifth Edition: pp. 415.

Chyuan–Wei Chen et al: "Liquid–phase epitaxial growth and characterization of InGaAsP layers grown on GaAsP substrates for application to orange light–emitting diodes"; 931 Journal of Applied Physics; 77 Jan. 15, 1999, No. 2; Woodbury, NY, US; pp. 905–909.

W. Zhu et al. ; "Oriented diamond films grown on nickel substrates"; 320 Applied Physics Lectures; 63 Sep. 1993, No. 12, Woodbury, NY, US; pp. 1640–1642.

M. Schreck et al. ; "Diamond/Ir/SrTi03: A material combination for improved heteroepitaxial diamond films"; Applied Physics Letters: vol. 74, No. 5; Feb. 1, 1999; pp. 650–652.

Yoshihiro Yokota et al.; "Cathodoluminescence of boron–doped heteroepitaxial diamond films on platinum"; Diamond and Related Materials Aug. 1999; pp. 1587–1591.

J. R. Busch et al ; "Linear Electro–Optic Response in Sol–Gel PZT Planar Waveguide"; Electronics Letters: Aug. 13, 1992; vol. 28 No. 17; pp. 1591–1692.

R. Droopdad et al; "Epitaxial Oxide Films on Silicon: Growth, Modeling and Device Properties"; Mat. Res. Soc. Symp. Proc. vol. 619; 2000 Materials Research Society; pp. 155–165.

H. Ohkubo et al.; "Fabrication of High Quality Perovskite Oxide Films by Lateral Epitaxy Verified with RHEED Oscillation"; 2419A Int. Conf. on Solid State Devices & Materials, Tsukuba, Aug. 26–28, 1992 : pp. 457–459.

Lin Li; "Ferroelectric/Superconductor Heterostructures"; Materials Science and Engineering: 29 (2000) pp. 153–181.

L. Fan et al.; "Dynaamic Beam Switching of Vertical–Cavity Surface–Emitting Lasers with Integrated Optical Beam Routers"; IEEE Photonics Technology Letters; vol. 9, No. 4; Apr. 4, 1997; pp. 505–507.

Y. Q. Xu, et al.; "(Mu, Sb) dropped–Pb (Zr, Ti)03 infrared detector arrays"; Journal of Applied Physics; vol. 88, No. 2; Jul. 15, 2000; pp. 1004–1007.

Kiyoko Kato et al, ; "Reduction of dislocations in InGaAas layer on GaAs using epitaxial lateral overgrowth"; 2300 Journal of Crystal Growth 115 (1991) pp. 174–179; Dec. 1991.

Nakagawara et al., Effects of Buffer Layers in Epitaxial Growth of $SrTiO_3$ Thin Film on SI(100), *J. Appl. Physics.*, 78(12), Dec. 15, 1995, pp. 7226–7230.

Suzuki et al., "A Proposal of Epitaxial Oxide Thin Film Structures For Future Oxide Electronics," *Materials Science and Engineering B41,* (1996), pp. 166–173.

W. F. Egelhoff et al., "Optimizing GMR Spin Valves: The Outlook for Improved Properties", *1998 Int'l Non Volatile Memory Technology Conference,* pp. 34–37.

Wang et al., "Processing and Performance of Piezoelectric Films", Univ. Of MD, Wilcoxon Research Col, and Motorola Labs, May 11, 2000.

M. Rotter et al., "Nonlinear Acoustoelectric Interactions in $GaAs/LiNbO_3$ Structures", *Applied Physics Letters,* vol. 75(7), Aug. 16, 1999, pp. 965–967.

K. Screenivas et al., "Surface Acoustic Wave Propagation on Lead Zirconate Titanate Thin Films, " *Appl. Phys. Lett.* 52 (9), Feb. 29, 1998, pp. 709–711.

M. Rotter et al., "Single Chip Fused Hybrids for Acousto–Electric and Acousto–Optic Applications," *1997 Applied Physics Letters,* vol. 70(16), Apr. 21, 1997, pp. 2097–2099.

A. Mansingh et al., "Surface Acoustic Wave Propagation in $PZT/YBCO/SrTiO_3$ Epitaxial Heterostructures," *Ferroelectric,* vol. 224, pp. 175–282, 1999.

S. Matthews et al., "Ferroelectric Field Effect Transistor Based on Epitaxial Perovskite Heterostructures", Science, vol. 276, Apr. 11, 1997, pp. 238–240.

R. Houdre et al., "Properties of GaAs on Si Grown by Molecular Beam Epitaxy," *Solid State and Materials Sciences,* vol. 16, Issue 2, 1990, pp. 91–114.

S.F. Fang et al., "Gallium Aresenide and Other Compound Semiconductors on Silicon," *J. Appl. Phys.,* 68(7), Oct. 1, 1990, pp. R31–R58.

Carlin et al., Impact of GaAs Buffer Thickness on Electronic Quality of GaAs Grown on Graded Ge/GeSi/Si Substrates, *Appl. Phys. Letter,* vol. 76, No. 14, Apr. 2000, pp. 1884–1888.

Ringel et al., "Epitaxial Integration of III–V Materials and Devices with Si Using Graded GeSi Buffers," 27th International Symposium on Compound Semiconductors, Oct. 2000.

Zogg et al., "Progress in Compound–Semiconductor–on–Silicon–Heteroepitaxy with Fluoride Buffer Layers," *J. Electrochem Soc.,* vol. 136, No. 3, Mar. 1998, pp. 775–779.

Xiong et al., "Oxide Defined GaAs Vertical–Cavity Surface–Emitting Lasers on Si Substrates," *IEEE Photonics Technology Letters,* vol. 12, No. 2, Feb. 2000, pp. 110–112.

Clem et al., "Investigation of PZT//LSCO//PI//Aerogel Thin Film Composites for Uncooled Pyroelectric IR Detectors," *Mat. Res. Soc. Symp. Proc.,* vol. 541, pp. 661–666, 1999.

Gunapala et al., "Bound–To–Quasi–Bound Quantam–Well Infrared Photodetectors," NASA Tech Brief, vol. 22, No. 9, Sep. 1998.

Abhay M. Joshi et al., "Monolithic InGaAs–on–silicon Wave Infrared Detector Arrays," *Intn. Society for Optical Engineering,* vol. 2999, pp. 211–224.

Bruley et al., "Nanostructure and Chemistry of a (100)MgO/(100) GaAs Interface," *Appl. Phys. Lett,* 65(5), Aug. 1994, pp. 564–566.

Fork et al., "Epitaxial MgO on Si(001) for Y–Ba–Cu–O Thin Film Growth by Pulsed Laser Deposition," *Appl. Phys. Lett.,* 58(20), May 20, 1991, pp. 2294–2296.

Himpsel et al., "Dialectrics on Semiconductors," *Materials Science and Engineering,* B1(1988), pp. 9–13.

Li et al., "Epitaxial La $_{0.67}$Sr$_{0.33}$MnO$_3$ Magnetic Tunnel Junctions," *J. Appl. Phys.* 81(8), Apr. 15, 1997, pp. 5509–5511.

O'Donnell et al., "Colossal Magnetoresistance Magnetic Tunnel Junctions Grown by Molecular–Beam Epitaxy," *Appl. Physics Letters,* vol. 76, No. 14, Apr. 3, 2000, pp. 1914–1916.

Mikami et al., "Formation of Si Epi/MgO–Ai$_2$O$_3$EPI./SiO$_3$/Si and its Epitaxial Film Quality," Fundamental Research Laboratories and Microelectronics Laboratories, pp. 31–34, 1983.

T. Asano et al., "An Epitaxial Si/Insulator/Si Structure Prepared by Vacuum Deposition of CaF$_2$ and Silicon," *Thin Solid Films,* vol. 93 (1982), pp. 143–150.

T. Chikyow et al., "Reaction and Regrowth Control of CeO$_2$ on Si(111) Surface for the Silicon–On–Insulator Structure," *Appl. Phys. Lett.,* vol. 65, No. 8, Aug. 22, 1994, pp. 1030–1032.

J.F. Kang et al., "Epitaxial Growth of CeO$_2$(100) Films on Si(100) Substrates by Dual Ion Beams Reactive Sputtering," *Solid State Communications,* vol. 108, No. 4, pp. 225–227, 1998.

R.A. Morgan et al., "Vertical–Cavity Surface–Emitting Lasers Come of Age," *SPIE,* vol. 2683, pp. 18–29.

"Technical Analysis of Qualcomm QCP–800 Portable Cellular Phone (Transmitter Circuitry)," Talus Corporation, Qualcomm QCP–800 Technical Analysis Report, Dec. 10, 1996, pp. 5–8.

Jo–Ey Wong, et al., "An Electrostatically–Actuated MEMS Switch for Power Applications"; IEEE, 2000; pp. 633–638.

T. Mizuno et al., "Electron and Hole Mobility Enhancement in Strained–Si MOSFET's on SiGe–on–Insulator Substrates Fabricated by SIMOX Technology"; IEEE Electron Device Letters, vol 21. No. 5, May 2000; pp. 230–232.

F.M. Buffer, et al.; "Strain–dependence of electron transport in bulk Si and deep–submicron MOSFET's" Computatural Electronics, 2000, Book of Abstracts, IWCE Glasgow 2000, 7th Int'l Workshop on, pp. 64–65.

S.S. Lu, et al.; "Piezoelectric field effect transistor (PEFET) using In$_{0.2}$Ga$_{0.8}$As/Ai$_{0.35}$Ga$_{0.6}$As/GaAs Strained layer structure on (111)B GaAs substrate"; Electronics Letters, 12th Ma 1994, vol. 30, No. 10; pp. 823–825.

Kihong Kim, et al, "On–Chip Wireless Interconnection with Integrated Antennas"; 2000 IEEE; pp. 20.2.1–20.3.4.

G. Passiopoulos, et al.; "V–Band Single Chip, Direct Carrier BPSK Modulation Transmitter with Integrated Patch Antenna"; 1998 IEEE MTT–S Digest; pp. 305–308.

Mau–Chung Frank Chang, et al.; "RF/Wireless Interconnect for Inter– and Intra–Chip Communications"; Proceedings of the IEEE, vol. 89, No. 4, Apr. 2001; pp. 456–466.

The Electronics Industry Report; Prismark; 2001; pp. 111–120.

J.K. Abrokwah, et al.; "A Manufacturable Complementary GaAs Process"; GaAs IC Symposium, IEEE, 1993; pp. 127–130.

H. Nagata, "A Preliminary Consideration of the Growth Behaviour of CeO$_2$, SrTIO$_3$ and SrVO$_3$ Films on Si Substrate, " *Thin Solid Films, 224,* 1993, pp. 1–3.

Nagata et al., "Heteroepitaxial Growth of CeO$_2$(001) Films on Si(001) Substrates by Pulsed Laser Deposition in Ultrahigh Vacuum," *Jpn. Jour. Appl. Phys.,* vol. 30, No. 68, Jun. 1991, pp. L1136–L1138.

Kado et al., "Heteroepitaxial Growth of SrO Films on Si Substrates," *J. Appl. Phys.,* 61(6), Mar. 15, 1987, pp. 2398–2400.

H. Ishiwara et al., "Epitaxial Growth of Perovskite Type Oxide Films on Substrates"; *Materials Research Symposium Proceedings,* vol. 220, pp. 595–600, Apr. 29–May 3, 1991.

J.K. Abrokawah, et al.; "A Manufacturable High–Speed Low–Power Complementary GaAs Process"; Extended Abstracts of the 1994 International Conference on Solid State Devices and Materials, Yokohama, pp. 592–594.

C.J. Palmstrom et al.; "Stable and Epitaxial Contacts to III–V Compound Semiconductors"; Contacts to Semiconductors Fundamentals and Technology; Noyles Publications, 1993, pp. 67–150.

Jayshri Sabarainathat, et al.; "Submicron three–dimensional infrared GaAs/Al$_x$O$_y$–based photonic crystal using single–step epitaxial growth"; Applied Physics Letters, vol. 78, No. 20, May 14, 2001; pp.3024–3026.

Philip Ball; "The Next Generation of Optical Fibers"; Technology Review, May 2001; pp. 55–61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantam Electronics 23 (1999) 51–96.

G. H. Jin, et al.; "PLZT Film Waveguide Mach–Zehinder Electrooptic Modulator"; Journal of Lightwave Technology, vol. 18, No. 6. Jun. 2000; pp.807–812.

D.E. Aspnes, et al.; "Steps on (001) sillicon surfaces"; J. Vac. Sci. Technol. B, vol. 5, No. 4, Jul/Aug 1987; pp. 939–944.

D.M. Newns, et al.; "Mott transition field effect transistor"; Applied Physics Letters, vol. 73, No. 6, Aug. 10, 1998; pp. 780–782.

Lucent Technologies, Inc. "Arrayed Waveguide Grating Multiplexer/Demultiplexer"; Jan. 2000; 4 pages.

Hisashi Shichijo, et al.; "Co–integration of GaAs MESFET and Si CMOS Circuits"; IEEE Electron Device Letters, vol. 9, No. 9, Sep. 1988; pp. 444–446.

H. Shichijo, et al.; "GaAs MESFET and Si CMOS Cointegration and Circuit Techniques"; 1988 IEEE; GaAs IC Symposium—239–242.

H. Shichijo, et al.; "Monolithic Process for Co–Integration of GaAs and Silicon Circuits"; 1988 IEEE; pp. 776–781.

Z.H. Zhu, et al, "Growth of InGaAs multi–quantam wells at 1.3 m wavelength on GaAs compliant substrates"; Applied Physics Letters, vol. 72, No. 20, May 18, 1998, pp. 2598–2600.

Kurt EisenBeiser, et al.; "Metamorphic InAiAs/InGaAs Enhancement Mode HEMT's on GaAs Substrates"; IEEE Electron Device Letters, vol. 20, No. 10, Oct. 1999; pp. 507–509.

Tomonori Nagashima, et al.; "Three–Terminal Tandem Solar Cells With a Back–Contact Type Bottom Cell" Higashifuji Technical Center, Toyota Motor Corporation; 4 pages.

James Schellenberg, et al.; "Low–Loss, Planar Monolithic Baluns for K/Ka–Band Applications"; 1999 IEEE MTT–S Digest; pp. 1733–1736.

Arnold Leitner et al; "Pulsed Laser Deposition of Superconducting Strontium Titanate Thin–Films"; ; Session K11–Thin Films and Borocarbides; Mixed Session, Wednesday Afternoon; Mar. 19, 1997; Room 1202 B, Conv. Center (Abstract).

R.D. Vispute; "High quality optoelectronic grade epitaxial AlN films on –$Al_2O_3$, Si and 6H–SiC by pulsed laser deposition"; Thin Solid Films 299 (1997), pp. 94–103.

T. Warren Weeks, et al.; "GaN thin films deposited via organometallic vapor phase epitaxy on (6H)–SIC(0001) using high–temperature monocrystalline AlN buffer layers" 320 Applied Physics Letters, vol. 67, No. 3, Jul 17, 1995, pp1401–403.

Z. Yu, et al.; "Epitaxial oxide thin films on Si(001)"; J. Vac. Sci. Technol. B, vol. 18, No. 4, Jul/Aug 2000; pp. 2139–2145.

Gentex Corporate Website; Photoelectronic Smoke Detectors—How They Work; 2001.

Jeffrey B. Cassady, et al.; "A Hybrid 6H–SiC Temperature Sensor Operational from 25 C to 500 C"; IEEE Transactions on Components, Packaging, and Manufacturing Technology—Part A, vol. 19, No. 3, Sep. 1996, pp. 416–422.

Ronald W. Waynant, et al.; "Optoelectronic Integrated Circuits"; Electro–Optics Handbook, McGraw–Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37–42.

D.A. Francis, et al.; "A single–chip linear optic amplifier"; OFC, 2001; Mar. 17–22, 2001.

G. Vogg et al.; "Epitaxial alloy films of zinti–phase Ca(Si1–xGex)2"; Journal of Crystal Growth 223 (2001); pp. 573–576.

Peter S. Guilfoyle, et al.; "Optoelectronic Architecture for High–Speed Switching and Processing Applications"; 1998 The Photonics Design and Applications Handbook; pp. H–399–H–406.

Gerald B. Stringfellow; "Organometallic Vapor–Phase Epitaxy; Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer–Verlag Berlin Heidelberg, 1989, 1996.

"Integration of GaAs on Si Using a Spinel Buffer Layer", IBM Technical Bulletin, vol. 30, No. 6, Nov. 1987, p. 365.

"GaInAs Superconducting FET," IBM Technical Bulletin, vol. 36, No. 8, Aug. 1993, p. 655–656.

"Epitaxial 3d Structure Using Mixed Spinels," IBM Technical Bulletin, vol. 30, No. 3, Aug. 1987, p. 1271.

Moon et al., "Roles of Buffer Layers In Epitaxial Growth of $SrTiO_3$ Films on Silicon Substrates," *Japan J of Appl. Phys.*, vol. 33, Mar. 1994, pp. 1472–1477.

Yodo et al., GaAs Heteroepitaxial Growth on Si Substrates with Thin Si Interlayers In situ Annealed at High Temperatures, *8257b Journal of Vacuum Science & Technology*, May/Jun. 1995, vol. 13, No. 3, pp. 1000–1005.

Cuomo et al., "Substrate Effect on the Superconductivity of $YBe_2Cu_3O_7$ Thin Films," AIP Conference 1988, pp. 141–148.

McKee et al., "Crystalline Oxides on Silicon: The First Five Monolayers," *Physical Review Letters*, vol. 81, No. 14, Oct. 1998, pp. 3014–3017.

McKee et al., "Molecular Beam Epitaxy Growth of Epitaxial Barium Silicide, Barium Oxide, and Barium Titanate on Silicon," *1991 American Institute of Physics*, pp. 782–784, Aug. 13, 1991.

Tambo et al., Molecular Beam Epitaxy Growth of $SrTiO_3$ Films on Si(100)–2x1 with SrO Buffer Layer, *Jpn. J. Appl. Phys.*, vol. 37, 1998, pp. 4454–4459.

McKee et al., "The MBE Growth and Optical Quality of $BaTiO_3$ Thin Films on MgO," *Mat. Res. Soc. Symp. Proc.*, vol. 341, Apr. 1994, pp. 309–314.

Mckee et al., "$BaSi_2$ and Thin Film Alkaline Earth Silicides on Silicon, " *Appl. Phys. Lett.*, 63(20), Nov. 1993, pp. 2818–2820.

Mckee et al., "Surface Structures and the Orthorhombic Transformation of Thin Film $BaSi_2$ on Silicon," *Mat. Res. Soc. Symp. Proc.*, vol. 221, pp. 131–136,.

Brian A. Floyd, et al.; "The projected Power Consumption of a Wireless Clock Distribution System and Comparison to Conventional Distribution Systems"; IEEE, 1999; pp. IITC99–249–IITC99–250.

Mori et al., "Epitaxial Growth of $SrTiO_3$ Films on Si(100) Substrates Using a Focused Electron Beam Evaporation Method," *Jpn. J. of Appl. Phys.*, vol. 30, No. 8A, Aug. 1991, pp. L1415–L1417.

Moon et al., "Growth of Crystalline $SrTiO_3$ Films on Si Substrates Using Thin Fluoride Buffer Layers and Their Electrical Properties," *Jpn. J. of Appl. Phys.*, vol. 33, (1994), pp. 5911–5916.

Farrow et al., "Heteroepitaxy of Dissimilar Materials," *Mat. Res. Soc. Symposium Proceedings*, vol. 221, pp. 29–34, Apr. 29–May 2, 1991.

Ishiwara et al., "Heteroepitaxy on Silicon: Fundamentals, Structure, and Devices," *Mat. Res. Soc.*, Symposium Proceedings, vol. 116, pp. 369–374, Apr. 5–8, 1988.

Douglas B. Chrisey, et al; Pulsed Laser Deposition of Thin Films; pp. 273–285.

B.A. Block, et al; "Photoluminescence properties of $Er^3$–doped $BaTiO_3$ thin films"; Appl. Phys. Lett. 65 (1), Jul. 4, 1994, pp. 25–27.

Kevin J. Chen et al; "A Novel Ultrafast Device: Resonant Tunneling High Electron Mobility Transistor"; Electron Devices Meetingk 1996; IEEE Hong Kong; Jun. 29, 1996; pp. 60–63, XP010210167.

Wenhua Zhu et al.; "Molecular Beam Epitaxy on GaAs on Si–on–Insulator"; 320 Applied Physics Letters 59 Jul. 6, 1991 No. 2; pp. 210–212.

Umesh K. Mishra et al; "Oxide Based Compound Semiconductor Electronics"; Electron Devices Meeting; 1997; Technical Digest, International; Washington, D.C.; Dec. 7–10, 1997; pp. 545–548.

J.M. Daughton et al.; "Applications of Spin Dependent Transport Materials"; J. Phys. D. Appl. Phys. 32(1999) R169–R177.

Wei Zhang et al.: "Stress Effect and Enhanced Magnetoresistance in $Le_{0.67}Ca_{0.33}MnO_{3-d}$ Films"; Physical Review, B. Condensed Matter; American Institute of Physics; vol. 58, No. 21, Part 1; Dec. 1, 1998; pp. 14143–14146.

Q.–Y. Tong et al.; "IOS–a new type of materials combination for system–on–a chip preparation"; 1999 IEEE International SOI Conference, Oct. 1999; pp. 104–105.

T. Kanniainen et al.; "Growth of Dielectric 1hfo2/Ta2O5 Thin Film Nanolaminate Capacitors By Atomic Layer Epitaxy"; Electrochemical Society Proceedings, U.S. Electrochemical Society; Pennington, N.J.; Aug. 31, 1997; pp. 36–46.

Myung Bok Lee; "Heteroepitaxial Growth of $BaTio_3$ Films on Si by Pulsed Laser Deposition"; Applied Physics Letters; Mar. 12, 1995; pp. 1331–1333.

Myung Bok Lee; "Formation and Characterization of Epitaxial $TiO_2$ and $BaTiO_3/TiO_2$ Films on Si Substrate"; Japan Journal Applied Physics Letters; vol. 34; 1995; pp. 808–811.

Gilbert Lecarpentier et al.; "High Accuracy Machine Automated Assembly for Opto Electronics"; 2000 Electronic Components and Technology Conference; pp. 1–4.

R. Ramesh; "Ferroelectric La–Sr–Co–O/Pb–Zr–Ti–O/La–Sr–Co–O Heterostructures on Silicon via Template Growth"; 320 Applied Physics Letters; 63(1998); Dec. 27; No. 26; pp. 3592–3594.

K. Eisenbeiser; "Field Effect Transistors with $SrTiO_3$ Gate Dielectric on Si"; Applied Physics Letters; vol. 76, No. 10; Mar. 6, 2000; pp. 1324–1328.

Stephen A. Mass; "Microwave Mixers"; Second Edition; 2pp.

Douglas J. Hamilton et al.; "Basic Integrated Circuit Engineering"; pp. 2; 1975.

Takeshi Obata; "Tunneling Magnetoresistance at Up to 270 K in $La_{0.2}Sr_{0.2}MnO_3SrTiO_3/La_{0.8}Sr_{0.2}MnO_3$ Junctions with 1.6–nm–Thick Barriers"; Applied Physics Letters; vol. 74, No. 2; Jan. 11, 1999; pp. 290–292.

Wei Zhang et al.; "Enhanced Magnetoresistance in La–Ca–Mn–O Films on Si Substrates Using $YbaCuO/CeO_2$ Heterostructures"; Physica C; vol. 282–287, No. 2003; Aug. 1, 1997; pp. 1231–1232.

Shogo Imada et al; "Epitaxial Growth of Ferroelectric $YmnO_3$ Thin Films on Si (111) Substrates by Molecular Beam Epitaxy"; Jpn. J. Appl. Phys. vol. 37 (1998); pp. 6497–6501; Part 1, No. 12A, Dec. 1998.

Ladislav Pust et al.; "Temperature Dependance of the Magnetization Reversal in Co(fcc)–BN–Co(poly hcp) Structures"; Journal of Applied Physics; vol. 85, No. 8, Apr. 1999; pp. 5765–5767.

C. Martinez; "Epitaxial Metallic Nanostructures on GaAs"; Surface Science; vol. 482–485; pp. 910–915; 2001.

Wen–Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998, pp. 305–316.

Zhu Dazhong et al.; "Design of $ZnO/SiO_2/Si$ Monolithic Integrated Programmable SAW Filter"; Proceedings of Fifth International Conference on Solid–State and Integrated Circuit Technology; Oct. 21–23, 1998; pp. 826–829.

Kirk–Othmer Encyclopedia of Chemical Technology; Fourth Edition, vol. 12; Fuel Resources to Heat Stabilizers; A Wiley–Interscience Publication; John Wiley & Sons.

Joseph W. Goodman et al; "Optical Interconnections For VLSI Systems"; Proceedings of the IEEE, vol. 72, No. 7 Jul. 1984.

Fathimulla et al.; "Monolithic Integration of InGaAs/InAlAs MODFETs and RTDs on InP–bonded–to Si Substrate"; Fourth International Conference on Indium Phosphide and Related Materials, Newport, RI, USA; Apr. 21–24, 1992 ; pp. 167–170; XP000341253; IEEE, New York, NY, USA; ISBN: 0–7803–0522–1.

H. Takashi et al.; "Arrayed–Waveguide Grating for Wavelength Division Multi/Demultiplexer With Nanometre REsolution"; Electronics Letters; vol. 26., No. 2, Jan. 18th, 1990.

Pierret, R.F.; "1/J–FET and MESFET"; Field Effect Devices; MA, Addison–Wesley; 1990; pp. 9–22.

M. Schreiter, et al.; "Sputtering of Self–Polarized PZT Films for IR–Detector Arrays"; 1998 IEEE; pp. 181–185.

Hideaki Adachi et al.; "Sputtering Preparation of Ferroelectric PLZT Thin Films and Their Opical Applications"; IEEE Transactions of Ultrasonics, Ferroelectrics and Frequency Control, vol. 38, No. 6, Nov. 1991.

A.J. Moulson et al.; "Electroceramics Materials Properties Applications"; Chapman & Hall; pp. 366–369.

P.A. Langjahr et al.; "Epitaxial Growth and Structure of Cubic and Pseudocubic Perovskite Films on Perovskite Substrates"; Mat. Res. Soc. Symp. Proc., vol. 401; 1995 Materials Research Society; pp. 109–114.

Wang et al.; "Depletion–Mode GaAs MOSFETs with Negligible Drain Current Drift and Hysteresis"; Electron Devices Meeting, 1998, IEDM '98 Technical Digest; pp. 67–70.

Ben G. Streetman; "Solid State Electronic Devices"; 1990, Prentice Hall; Third Edition; pp. 320–322.

A.Y Wu et al.; "Highly Oriented $(Pb,La)(Zr,Ti)O_3$ Thin Films on Amorphous Substrates"; IEEE, 1992; pp. 301–304.

Timothy E. Glassman et al.; "Evidence for Cooperative Oxidation of MoCVD Precursors Used in $Ba_xSr_{1-x}TiO_3$ Film Growth"; Mat. Res. Soc. Symp. Proc. vol. 446, 1997 Materials Research Society; pp. 321–326.

S.N. Subbarao et al.; "Monolithic PIN Photodetector and FET Amplifier on GaAs–os–Si"; IEEE; GaAs IC Symposium–163–166; 1989.

T.A. Langdo et al.; "High Quality Ge on Si by Epitaxial Necking"; Applied Physics Letters; vol. 76, No. 25; pp. 3700–3702; Jun. 19, 2000.

Chenning Hu et al.; Solar Cells From Basics to Advanced Systems; McGraw–Hill Book Company; 1983.

O.J. Painter et al; "Room Temperature Photonic Crystal Defect Lasers at Near–Infrared Wavelengths in InGaAsp"; Journal of Lightwave Technology, vol. 17, No. 11; Nov. 1999.

C. Donn et al.; "A 16–Element, K–Band Monolithic Active Receive Phased Array Antenna"; Antennas and Propagation Society International Symposium, 1988; pp. 188–191, vol. 1; Jun. 6–10, 1988.

Don. W. Shaw; "Epitaxial GaAs on Si: Progress and Potential Applications"; Mat. Res. Soc. Symp. Proc.; pp. 15–30; 1987.

G.J.M. Dormans, et al.; "PbTiO$_3$/Thin Films Grown by Organometallic Chemical Vapour Deposition"; Third International Symposium on Integrated Ferroelectrics; Apr. 3–5, 1991 (Abstract).

P.J. Borrelli et al.; "Compositional and Structural Properties of Sputtered PLZT Thin Films"; Ferroelectric Thin Films II Symposium; Dec. 2–4, 1991 (Abstract).

Ranu Nayak et al; "Enhanced acousto–optic diffraction efficiency in a symmetric SrRiO3/BaTiO3/SrTiO3 thin–film heterostructure"; Nov. 1, 2000; vol. 39, No. 31; Applied Optics; pp. 5847–5853.

Ranu Nayak et al; "Studies on acousto–optical interaction in SrTiO3/BaTiO3/SrTiO3 epitaxial thin film heterostructures"; J. Phys. D: Appl. Phys. 32 (1999) 380–387.

S.K. Tewksbury et al.; "Cointegration of Optoelectronics and Submicron CMOS"; Wafer Scale Integration; 1993; Proceedings, Fifth Annual IEEE; Jan. 29, 1993; pp. 358–367.

V. Kaushik et al.; "Device Characteristics of Crystalline Epitaxial Oxides on Silicon"; Device Research Conference, 2000; Conference Digest 58th DRC; pp. 17–21; Jun. 19–20, 2000.

Katherine Derbyshire; "Prospects Bright for Optoelectronics Volume, Cost Drive Manufacturing for Optical Applications"; Semiconductor Magazine; vol. 3, No. 3; Mar. 2002.

Alex Chediak et al; "Integration of GaAs/Si with Buffer Layers and Its Impact on Device Integration"; TiCS 4, Prof. Sands. MSE 225, Apr. 12, 2002; pp. 1–5.

S.A. Chambers et al; "Band Discontinuities at Epitaxial SrTiO3/Si(001) Heterojunctions"; Applied Physics Letters; vol. 77, No. 11; Sep. 11, 2000; pp. 1662–1664.

H. Wang et al.; "GaAs/GaAlAs Power HBTs for Mobile Communications"; Microwave Symposium Digest; 1993 IEEE; vol. 2.; pp. 549–552.

Y. Ota et al.; "Application of Heterojunction FET to Power Amplifier for Cellular Telephone"; Electronics Letters May 26th, 1994; vol. 30, No. 11; pp. 906–907.

Keiichi Sakuno et al; "A 3.5W HBT MMIC Power Amplifier Module for Mobile Communications"; IEEE 1994; Microwave and Millimeter–Wave Monolithic Circuits Symposium; pp. 63–68.

Mitsubishi Semiconductors Press Release (GaAs FET's) Nov. 8, 1999; pp. 1–2.

R.J. Matyi et al; "Selected Area Heteroepitaxial Growth of GaAs on Silicon for Advanced Device Structures"; 2194 Thin Solid Films: 181 Dec. 10, 1989; No. 1; pp. 213–225.

K. Nashimoto et al; "Patterning of Nb, LaOnZr, TiO3 Waveguides for Fabricating Micro–Optics Using Wet Etching and Solid–Phase Epitaxy"; Applied Physics Letters; vol. 75, No. 8; Aug. 23, 1999; pp. 1054–1056.

Bang–Hung Tsao et al; "Sputtered Barium Titanate and Barium Strontium Titanate Films for Capacitor Applications"; Applications of Ferroelectrics, 2000; Proceedings of the 2000 12th International Symposium on vol. 2; pp. 837–840.

Man Fai Ng et al; "Heteroepitaxial growth of lanthanum aluminate films derived from mixed metal nitrates"; Journal of Materials Research; vol. 12, No. 5; pp. 1306.

Yuji Matsumoto et al.; "Room–Temperature Ferromagnetism in Transparent Transition Metal–Doped Titanium Dioxide"; Science; Feb. 2, 2001; vol. 291; pp. 854–856.

S.A. Chambers et al.; "Epitaxial Growth and Properties of Ferromagnetic Co–Doped TiO2 Anatase", Applied Physics Letters; vol. 79, No. 21; Nov. 19, 2001; pp. 3467–3469.

* cited by examiner

METHOD FOR GROWING A
MONOCRYSTALLINE OXIDE LAYER AND
FOR FABRICATING A SEMICONDUCTOR
DEVICE ON A MONOCRYSTALLINE
SUBSTRATE

FIELD OF THE INVENTION

This invention relates generally to method for fabricating semiconductor structures and devices, and more specifically to a method for growing a monocrystalline oxide layer on a monocrystalline substrate and to a method for fabricating semiconductor structures and devices that include such an oxide layer.

BACKGROUND OF THE INVENTION

Semiconductor devices often include multiple layers of conductive, insulating, and semiconductive layers. Often, the desirable properties of such layers improve with the crystallinity of the layer. For example, the electron mobility and band gap of semiconductive layers improves as the crystallinity of the layer increases. Similarly, the free electron concentration of conductive layers and the electron charge displacement and electron energy recoverability of insulative or dielectric films improves as the crystallinity of these layers increases.

For many years, attempts have been made to grow various monolithic thin films on a foreign substrate such as silicon (Si). To achieve optimal characteristics of the various monolithic layers, however, a monocrystalline film of high crystalline quality is desired. Attempts have been made, for example, to grow various monocrystalline layers on a substrate such as germanium, silicon, and various insulators. These attempts have generally been unsuccessful because lattice mismatches between the host crystal and the grown crystal have caused the resulting layer of monocrystalline material to be of low crystalline quality.

If a large area thin film of high quality monocrystalline material was available at low cost, a variety of semiconductor devices could advantageously be fabricated in or using that film at a low cost compared to the cost of fabricating such devices beginning with a bulk wafer of the monocrystalline material or in an epitaxial film of such material on a bulk wafer of the same material. In addition, if a thin film of high quality monocrystalline material could be realized beginning with a bulk wafer such as a silicon wafer, an integrated device structure could be achieved that took advantage of the best properties of both the silicon and the high quality monocrystalline material.

Accordingly, a need exists for a method of fabricating a heterogeneous semiconductor structure that provides a high quality monocrystalline film or layer over another monocrystalline material. Further, there is a need for a method for fabricating semiconductor structures having a grown monocrystalline film, either semiconductor, compound semiconductor, insulative, or metallic, overlying a monocrystalline oxide film that, in turn, overlies a monocrystalline substrate. To achieve these needs, there is a further need for a method for growing a monocrystalline oxide of high crystalline quality on a monocrystalline semiconductor substrate.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
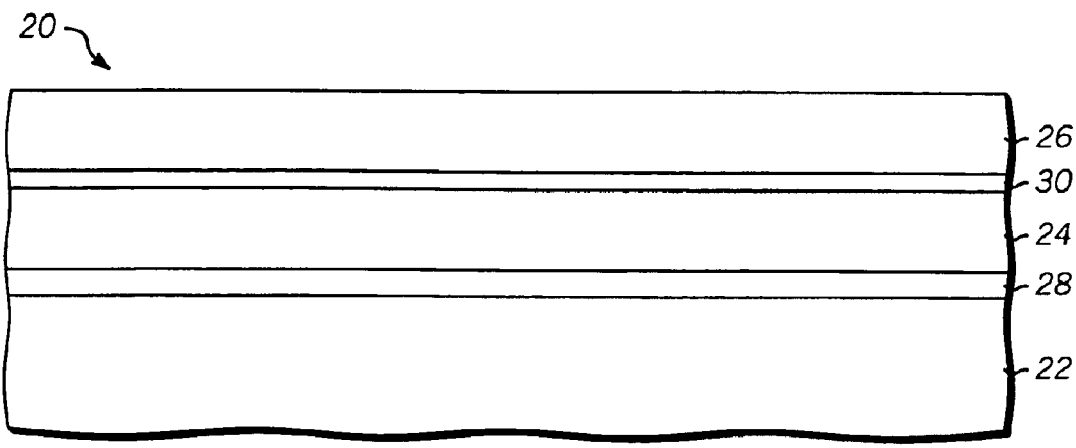
FIGS. 1–4 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and a monocrystalline material layer 26. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly used in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and monocrystalline material layer 26. As will be explained more fully below, the template layer helps to initiate the growth of the monocrystalline material layer on the accommodating buffer layer. The amorphous intermediate layer helps to relieve the strain in the accommodating buffer layer and, by doing so, aids in the growth of a high crystalline quality accommodating buffer layer.

Substrate 22, in accordance with an embodiment of the invention, is a monocrystalline semiconductor or compound semiconductor wafer, preferably of large diameter. The wafer can be of, for example, a material from Group IV of the periodic table. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Substrate 22 may also include an epitaxial layer (not illustrated) to facilitate the fabrication of semiconductor devices as will be explained more fully below. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline material layer 26 which may comprise a semiconductor material, a compound semiconductor material, a monocrystalline oxide layer, or another type of material such as a metal or a non-metal.

Accommodating buffer layer 24 is preferably a monocrystalline oxide or nitride material selected for its crystalline compatibility with the underlying substrate and with the overlying material layer. For example, the material could be an oxide or nitride having a lattice structure closely matched to the substrate and to the subsequently applied monocrystalline material layer. Materials that are suitable for the accommodating buffer layer include metal oxides such as the alkaline earth metal/transition metal oxides such as alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, gadolinium oxide, other perovskite oxide materials, and other monocrystalline metal oxides. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically, although not necessarily, include at least two different metallic elements. In some specific applications, the metal oxides or nitrides may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nanometers (nm). As will be explained more fully below, in certain applications the thickness of the amorphous layer should be minimized, especially during the initial stages of the growth of the monocrystalline buffer layer.

The material for monocrystalline material layer 26 can be selected, as necessary, for a particular structure or application. For example, the monocrystalline material of layer 26 may comprise a compound semiconductor which can be selected, as needed for a particular semiconductor structure, from any of the Group IIIA and VA elements (III–V semiconductor compounds), mixed III–V compounds, Group II (A or B) and VIA elements (II–VI semiconductor compounds), mixed II–VI compounds, Group IV and VI elements (IV–VI semiconductor compounds), mixed IV–VI compounds, Group IV element (Group IV semiconductors), and mixed Group IV compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), lead selenide (PbSe), lead telluride (PbTe), lead sulfide selenide (PbSSe), silicon (Si), germanium (Ge), silicon germanium (SiGe), silicon germanium carbide (SiGeC), and the like. However, monocrystalline material layer 26 may also comprise other semiconductor materials, monocrystalline oxides, metals, or non-metal materials which are used in the formation of semiconductor structures, devices and/or integrated circuits.

Appropriate materials for template 30 are discussed below. Suitable template materials chemically bond to the surface of the accommodating buffer layer 24 at selected sites and provide sites for the nucleation of the epitaxial growth of monocrystalline material layer 26. When used, template layer 30 has a thickness ranging from about 1 to about 10 monolayers. Here a monolayer of a perovskite oxide, such as $SrTiO_3$, is defined as a layer of such an oxide having a thickness of its unit cell length along the growth direction. A monolayer of one of its components, such as a monolayer of Sr, is defined as the equivalent amount of atoms of this type, in this case the Sr atoms, contained in a monolayer of such an oxide. The template may also incorporate a wetting layer which helps to initiate high quality two dimensional crystalline growth.

Figure 2:
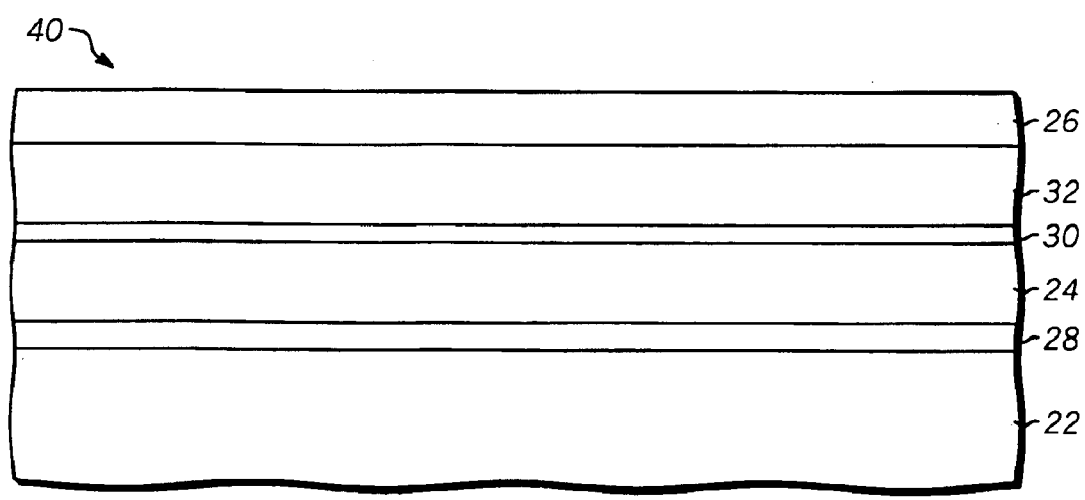

FIG. 2 illustrates, in cross section, a portion of a semiconductor structure 40 in accordance with a further embodiment of the invention. Structure 40 is similar to the previously described semiconductor structure 20, except that an additional buffer layer 32 is positioned between accommodating buffer layer 24 and monocrystalline material layer 26. Specifically, the additional buffer layer is positioned between template layer 30 and the overlying layer of monocrystalline material. The additional buffer layer, formed of a semiconductor or compound semiconductor material when the monocrystalline material layer 26 comprises a semiconductor or compound semiconductor material, serves to provide a lattice compensation when the lattice constant of the accommodating buffer layer cannot be adequately matched to the overlying monocrystalline semiconductor or compound semiconductor material layer.

Figure 3:
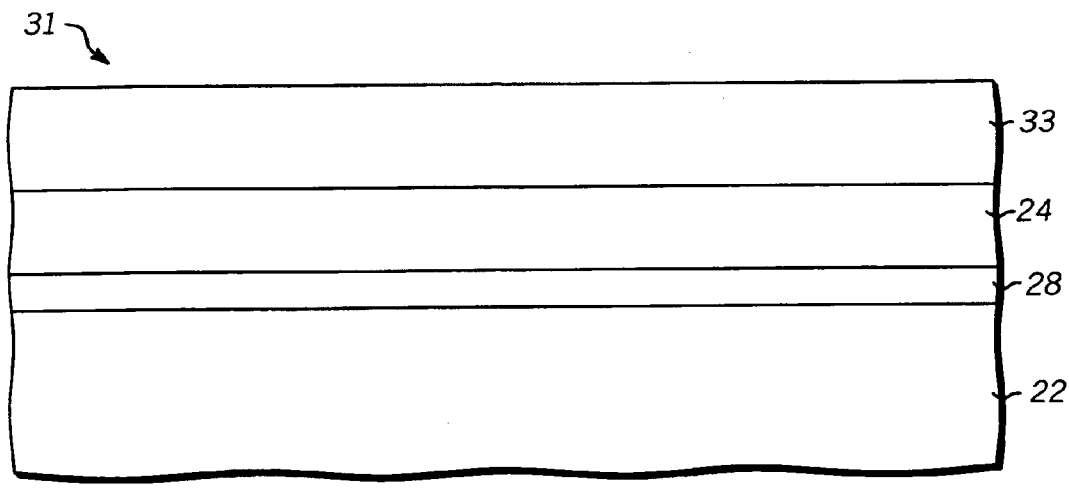

The structures and materials described above in connection with FIGS. 1 and 2 illustrate structures for growing monocrystalline material layers over a monocrystalline substrate. In some applications a monocrystalline material layer such as layer 26 is a necessary part of the device being fabricated. In other applications the accommodating buffer layer may become an integral part of the device being fabricated, such as a gate insulator of a field effect transistor. In such other applications the material layer formed overlying the monocrystalline accommodating buffer layer may or may not be monocrystalline. For example, as illustrated in FIG. 3, semiconductor structure 31 includes, in accordance with a further embodiment of the invention, a monocrystalline semiconductor substrate 22, amorphous intermediate layer 28, accommodating buffer layer 24, and overlying layer 33. The overlying layer may or may not be monocrystalline. For example, if semiconductor structure 31 is used in the fabrication of a field effect transistor, layer 33 may be polycrystalline silicon used for the fabrication of a gate electrode. Accommodating buffer layer 24, in such embodiment, could be used as a gate dielectric of the field effect transistor. Hence in such a structure, layer 24 is not an "accommodating buffer" as that term is used elsewhere in this disclosure, i.e., a monocrystalline layer providing an accommodation of underlying and overlying crystal lattice constants; but for sake of consistency, any monocrystalline layer grown overlying substrate 22 will be referred to by that term.

Figure 4:
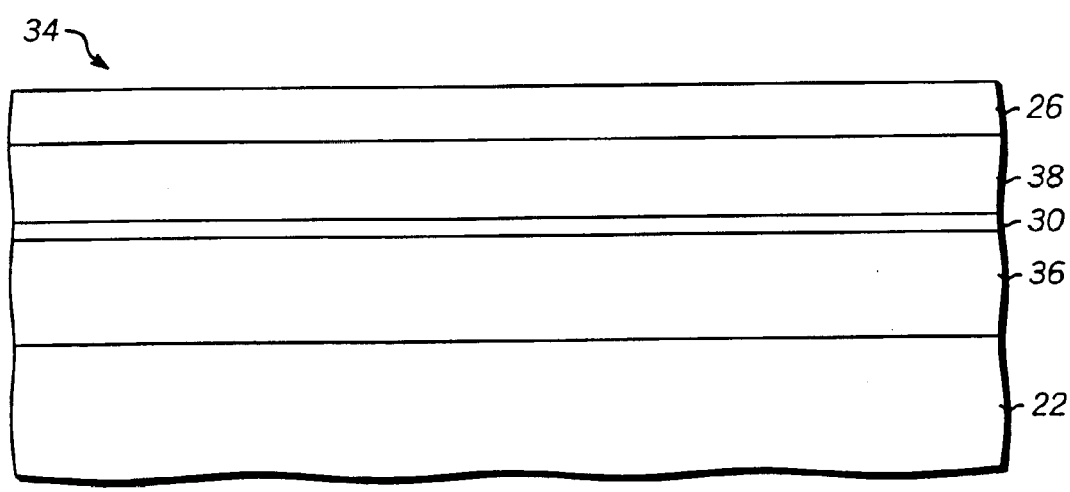

FIG. 4 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional monocrystalline layer 38.

As explained in greater detail below, amorphous layer 36 may be formed by first forming an accommodating buffer layer and an amorphous interface layer in a similar manner to that described above. Monocrystalline layer 38 is then formed (by epitaxial growth) overlying the monocrystalline accommodating buffer layer. The accommodating buffer layer then optionally may be exposed to an anneal process to convert at least a portion of the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and additional monocrystalline layer 26 (subsequent to layer 38 formation) relieves stresses between layers 22 and 38 and provides a true compliant substrate for subsequent processing—e.g., monocrystalline material layer 26 formation.

Additional monocrystalline layer 38 may include any of the materials described throughout this application in connection with either of monocrystalline material layer 26 or additional buffer layer 32. For example, when monocrystalline material layer 26 comprises a semiconductor or compound semiconductor material, layer 38 may include monocrystalline Group IV or monocrystalline compound semiconductor materials.

In accordance with one embodiment of the present invention, additional monocrystalline layer 38 serves as an anneal cap during layer 36 formation and as a template for subsequent monocrystalline layer 26 formation. Accordingly, layer 38 is preferably thick enough to provide a suitable template for layer 26 growth (at least one monolayer) and thin enough to allow layer 38 to form as a substantially defect free monocrystalline material layer.

In accordance with another embodiment of the invention, additional monocrystalline layer 38 comprises monocrystalline material (e.g., a material discussed above in connection with monocrystalline layer 26) that is thick enough to allow the formation of devices therein. In this case, a semiconductor structure in accordance with the present invention does not include monocrystalline material layer 26. In other words, the semiconductor structure in accordance with this embodiment includes only one monocrystalline layer disposed above amorphous oxide layer 36.

The following non-limiting, illustrative examples illustrate various combinations of materials useful in structures 20, 40, 31, and 34 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the underlying substrate and subsequently formed layer 26. The accommodating buffer layer can have a thickness of about 2 to about 100 nanometers (nm) and preferably has a thickness of about 5 nm. In general, it is desired to have an accommodating buffer layer thick enough to isolate the monocrystalline material layer 26 from the substrate to obtain the desired electrical and optical properties. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1 to 2 nm.

In accordance with this embodiment of the invention, monocrystalline material layer 26 is a compound semiconductor layer of gallium arsenide (GaAs) or aluminum gallium arsenide (AlGaAs) having a thickness of about 1 nm to about 100 micrometers ($\mu$m) and preferably having a thickness of about 0.5 $\mu$m to 10 $\mu$m. The thickness generally depends on the application for which the layer is being prepared. To facilitate the epitaxial growth of the gallium arsenide or aluminum gallium arsenide on the monocrystalline oxide, the oxide layer is capped with a template layer. The template layer is preferably 0.5–10 monolayers of Ti—As, Ti—O—As, Ti—O—Ga, Sr—O—As, Sr—Ga—O, or Sr—Al—O. By way of a preferred example, 0.5–2 monolayers of Ti—As or Ti—O—As have been found effective to successfully grow GaAs layers. To facilitate high quality two dimensional monocrystalline growth of layer 26, the template layer can also include a wetting layer on its upper surface. As explained more fully below, the wetting layer is formed of a material that changes the surface energy of the accommodating buffer layer to aid in the monocrystalline growth of the overlying layer. Suitable materials for the wetting layer include, for example, metals, intermetallics, and metal oxides having a cubic crystalline structure. Examples of such materials include NiAl, FeAl, CoAl, Ni, Co, Fe, Cu, Ag, Au, Ir, Rh, Pt, Pd, Rb, Cs, CoO, FeO, $Cu_2O$, $Rb_2O_3$, $Cs_2O_3$, and NiO. The thickness of the wetting layer is preferably 0.5–5.0 monolayers.

EXAMPLE 2

In accordance with a further embodiment of the invention, monocrystalline substrate 22 is a silicon substrate as described above. The accommodating buffer layer is a monocrystalline oxide of strontium or barium zirconate or hafnate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 4 nm to ensure adequate crystalline and surface quality and is formed of a monocrystalline $SrZrO_3$, $BaZrO_3$, $SrHfO_3$, $BaSnO_3$ or $BaHfO_3$. For example, the accommodating buffer layer can be a monocrystalline oxide layer of $BaZrO_3$ grown at a temperature of about 700 degrees C. The lattice structure of the resulting crystalline oxide exhibits a 45 degree rotation with respect to the substrate silicon lattice structure.

An accommodating buffer layer formed of these zirconate or hafnate materials is suitable for the growth of a monocrystalline material layer which comprises compound semiconductor materials in the indium phosphide (InP) system. In this system, the compound semiconductor material can be, for example, indium phosphide (InP), indium gallium arsenide (InGaAs), aluminum indium arsenide, (AlInAs), or aluminum gallium indium arsenide phosphide (AlGaInAsP), having a thickness of about 1.0 nm to 10 μm. A suitable template for this structure is about 0.5–10 monolayers of one of a material M—N or a material M—O—N, wherein M is selected from at least one of Zr, Hf, Ti, Sr, and Ba and N is selected from at least one of As, P, Ga, Al, and In. Preferably the template is about 0.5–2 monolayers of one of these materials. By way of an example, for a barium zirconate accommodating buffer layer, the surface is terminated with 0.5–2 monolayers of zirconium followed by deposition of 0.5–2 monolayers of arsenic to form a Zr—As template. As with the example above, the template layer may be completed with an appropriate wetting layer to facilitate the two dimensional monocrystalline growth of a subsequent layer. A monocrystalline layer of the compound semiconductor material from the indium phosphide system is then grown on the template layer. The resulting lattice structure of the compound semiconductor material exhibits a 45 degree rotation with respect to the accommodating buffer layer lattice structure and a lattice mismatch to (100) InP of less than 2.5%, and preferably less than about 1.0%.

EXAMPLE 3

In accordance with a further embodiment of the invention, a structure is provided that is suitable for the growth of an epitaxial film of a monocrystalline material comprising a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 3–10 nm. The monocrystalline II–VI compound semiconductor material grown epitaxially overlying the accommodating buffer layer can be, for example, zinc selenide (ZnSe) or zinc sulfur selenide (ZnSSe). A suitable template for this material system includes 0.5–10 monolayers of zinc-oxygen (Zn—O) followed by 0.5–2 monolayers of an excess of zinc followed by the selenidation of zinc on the surface. Alternatively, a template can be, for example, 0.5–10 monolayers of strontium-sulfur (Sr—S) followed by the ZnSSe. Again, the template can also include an appropriate wetting layer.

EXAMPLE 4

This embodiment of the invention is an example of structure 40 illustrated in FIG. 2. Substrate 22, accommodating buffer layer 24, and monocrystalline material layer 26 can be similar to those described in example 1. In addition, an additional buffer layer 32 serves to alleviate any strains that might result from a mismatch between the crystal lattice of the accommodating buffer layer and the lattice of the overlying monocrystalline material. Buffer layer 32 can be a layer of germanium or a strain compensated superlattice of GaAs, aluminum gallium arsenide (AlGaAs), indium gallium phosphide (InGaP), aluminum gallium phosphide (AlGaP), indium gallium arsenide (InGaAs), aluminum indium phosphide (AlInP), gallium arsenide phosphide (GaAsP), or indium gallium phosphide (InGaP). In accordance with one aspect of this embodiment, buffer layer 32 includes a $GaAs_xP_{1-x}$ superlattice, wherein the value of x ranges from 0 to 1. In accordance with another aspect, buffer layer 32 includes an $In_yGa_{1-y}P$ superlattice, wherein the value of y ranges from 0 to 1. By varying the value of x or y, as the case may be, the lattice constant is varied from bottom to top across the superlattice to create a match between lattice constants of the underlying oxide and the overlying monocrystalline material which, in this example, is a compound semiconductor material. The compositions of other compound semiconductor materials, such as those listed above, may also be similarly varied to manipulate the lattice constant of layer 32 in a like manner. The superlattice can have a thickness of about 50–500 nm and preferably has a thickness of about 100–200 nm. The superlattice period can have a thickness of about 2–15 nm, preferably, 2–10 nm. The template for this structure can be the same of that described in Example 1. Alternatively, buffer layer 32 can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about 0.5–2 monolayers can be used as a nucleating site for the subsequent growth of the monocrystalline germanium layer. The formation of the accommodating buffer layer is capped with either 0.5–1 monolayer of strontium or 0.5–1 monolayer of titanium to act as a nucleating site for the subsequent deposition of the monocrystalline germanium. The layer of strontium or titanium provides a nucleating site to which the first monolayer of germanium can bond. The same wetting agents described above in Example 1 can be used to initiate high quality two dimensional growth of the germanium layer.

EXAMPLE 5

This example also illustrates materials useful in a structure 40 as illustrated in FIG. 2. Substrate material 22, accommodating buffer layer 24, monocrystalline material layer 26 and template layer 30 can be the same as those described above in Example 2. In addition, additional buffer layer 32 is inserted between the accommodating buffer layer and the overlying monocrystalline material layer. The buffer layer, a further monocrystalline material which, in this example, comprises a semiconductor material, can be, for example, a graded layer of indium gallium arsenide (InGaAs) or indium aluminum arsenide (InAlAs). In accordance with one aspect of this embodiment, additional buffer layer 32 includes InGaAs in which the indium in the composition varies from 0 to about 50%. The additional buffer layer 32 preferably has a thickness of about 10–30 nm. Varying the composition of the buffer layer from GaAs to InGaAs serves to provide a lattice match between the underlying monocrystalline oxide material and the overlying layer of monocrystalline material which in this example is a compound semiconductor material. Such a buffer layer is especially advantageous if there is a lattice mismatch between accommodating buffer layer 24 and monocrystalline material layer 26.

EXAMPLE 6

This example provides exemplary materials useful in structure 31, as illustrated in FIG. 3. Substrate material 22 is, for example, a monocrystalline silicon wafer as commonly used in the semiconductor industry for the fabrication of semiconductor devices and integrated circuits. Depending on the device or integrated circuit to be fabricated, the wafer may be a bulk wafer or it may be a bulk wafer having an epitaxial silicon layer formed on the top surface thereof. Impurity doped regions may be formed in the substrate as, for example, source and drain regions of a field effect transistor. Amorphous intermediate layer 28 is a silicon oxide formed by the oxidation of the surface of the silicon substrate. Accommodating buffer layer 24 is a monocrystalline layer of strontium titanate having an initial thickness of 1–10 monolayers, and preferably an initial thickness of 3–6 monolayers. Layer 33 formed overlying the accommodating buffer layer is a layer of polycrystalline silicon from which a gate electrode of the field effect transistor will be formed. The layer of strontium titanate serves as a gate dielectric of the transistor. In an alternate embodiment, layer 33 can be a layer of monocrystalline strontium zirconate to form a so called "medium k" dielectric of the transistor. A gate electrode would then be formed overlying the strontium zirconate dielectric layer. In the fabrication of semiconductor structure 31, it may be advantageous to minimize the thickness of amorphous intermediate layer 28. The amorphous intermediate layer is one component of the gate dielectric of the field effect transistor, and it is usually desirable to minimize that dielectric thickness. Additionally, the silicon oxide that forms the amorphous intermediate layer is also a relatively "low k" dielectric and is thus to be minimized.

EXAMPLE 7

This example provides exemplary materials useful in structure 34, as illustrated in FIG. 4. Substrate material 22, template layer 30, and monocrystalline material layer 26 may be the same as those described above in connection with example 1.

Amorphous layer 36 is an amorphous oxide layer which is suitably formed of a combination of amorphous intermediate layer materials (e.g., layer 28 materials as described above) and accommodating buffer layer materials (e.g., layer 24 materials as described above). For example, amorphous layer 36 may include a combination of $SiO_x$ and $Sr_zBa_{1-z}TiO_3$ (where z ranges from 0 to 1) which combine or mix, at least partially, during an anneal process to form amorphous oxide layer 36.

The thickness of amorphous layer 36 may vary from application to application and may depend on such factors as desired insulating properties of layer 36, type of monocrystalline material comprising layer 26, and the like. In accordance with one exemplary aspect of the present embodiment, layer 36 thickness is about 1 nm to about 100 nm, preferably about 1–10 nm, and more preferably about 3–5 nm.

Layer 38 comprises a monocrystalline material that can be grown epitaxially over a monocrystalline oxide material such as the material used to form accommodating buffer layer 24. In accordance with one embodiment of the invention, layer 38 includes the same materials as those comprising layer 26. For example, if layer 26 includes GaAs, layer 38 also includes GaAs. However, in accordance with other embodiments of the present invention, layer 38 may include materials different from those used to form layer 26. In accordance with one exemplary embodiment of the invention, layer 38 if formed to a thickness of about 1 nm to about 500 nm.

Referring again to FIGS. 1–4, substrate 22 is a monocrystalline substrate such as, for example, a monocrystalline silicon or gallium arsenide substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be substantially equal or, alternatively, must be such that upon rotation of one crystal orientation with respect to the other crystal orientation, a substantial match in lattice constants is achieved. In this context the terms "substantially equal" and "substantial match" mean that there is sufficient similarity between the lattice constants to permit the growth of a high quality crystalline layer on the underlying layer.

Figure 5:
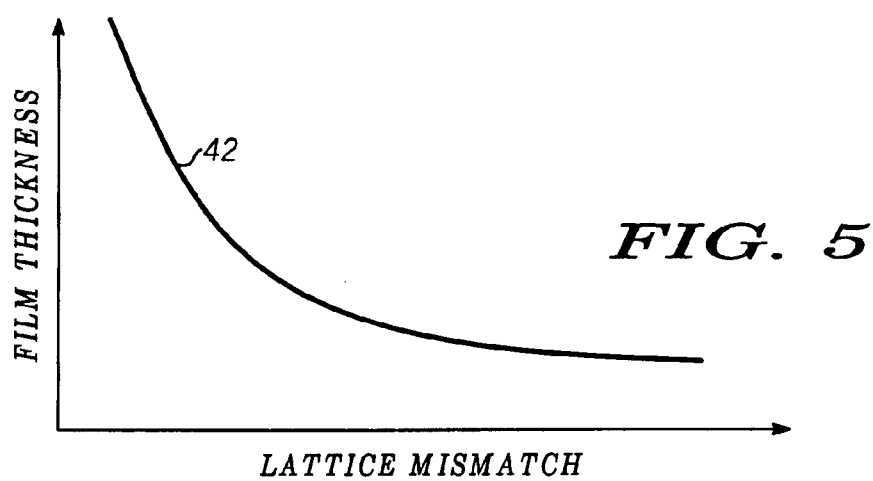
FIG. 5 illustrates graphically the relationship between maximum attainable film thickness and lattice mismatch between a host crystal and a grown crystalline overlayer.

FIG. 5 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that have a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is a (100) oriented monocrystalline silicon wafer and accommodating buffer layer 24 is a layer of strontium barium titanate. Substantial matching of lattice constants between these two materials is achieved by suitably choosing the ratio of strontium to barium and by rotating the crystal orientation of the titanate material by 45° with respect to the crystal orientation of the silicon substrate wafer. The inclusion in the structure of amorphous interface layer 28, a silicon oxide layer in this example, if it is of sufficient thickness, serves to reduce strain in the monocrystalline titanate layer that might result from any mismatch in the lattice constants of the host silicon wafer and the grown titanate layer. As a result, in accordance with an embodiment of the invention, a high quality, thick, monocrystalline titanate layer is achievable.

Still referring to FIGS. 1–4, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. For example, if the grown crystal is gallium arsenide, aluminum gallium arsenide, zinc selenide, or zinc sulfur selenide and the accommodating buffer layer is monocrystalline $Sr_xBa_{1-x}TiO_3$, substantial matching of crystal lattice constants of the two materials is achieved by a suitable choice for x and by rotating the crystal orientation of the grown layer by 45° with respect to the orientation of the host monocrystalline oxide. Similarly, if the host material is a strontium or barium zirconate or a strontium or barium hafnate or barium tin oxide and the compound semiconductor layer is indium phosphide or gallium indium arsenide or aluminum indium arsenide, substantial matching of crystal lattice constants can be achieved proper choice of the host oxide material and by rotating the orientation of the grown crystal layer by 45° with respect to the host oxide crystal. In some instances, a crystalline semiconductor buffer layer between the host oxide and the grown monocrystalline material layer can be used to reduce strain in the grown monocrystalline material layer that might result from small differences in lattice constants. Better crystalline quality in the grown monocrystalline material layer can thereby be achieved.

The following example illustrates a process, in accordance with one embodiment of the invention, for fabricating a semiconductor structure such as the structures depicted in FIGS. 1–4. The process starts by providing a monocrystalline semiconductor substrate comprising silicon or germanium. In accordance with a preferred embodiment of the invention, the semiconductor substrate is a silicon wafer having a (100) orientation. The substrate is oriented on axis or, if desired, up to 8° off axis towards any desired crystallographic direction. At least a portion of the semiconductor substrate has a bare surface, although other portions of the substrate may encompass other structures. The term "bare" in this context means that the surface in that portion of the substrate has been cleaned to remove any oxides, contaminants, or other foreign material. As is well known, bare silicon is highly reactive and readily forms a native oxide. The term "bare" is intended to encompass such a native oxide. In accordance with one embodiment of the invention, a thin silicon oxide is then intentionally grown on the semiconductor substrate. The thin silicon oxide is grown immediately prior to the formation of the monocrystalline accommodating buffer layer, and can be grown by thermal or chemical oxidation of the silicon surface. In accordance with one embodiment of the invention, the thin silicon oxide is grown by exposing the substrate surface to an ultraviolet (UV) lamp in the presence of ozone for a time period of up to about 20 minutes. The wafer is initially at ambient room temperature, but is heated by the UV lamp to a temperature of between 20° C. and 100° C. by the end of the treatment. Alternatively, in accordance with a further embodiment of the invention, the semiconductor substrate can be exposed to an rf or an ECR oxygen plasma. During such treatment the temperature of the substrate is maintained at a temperature of between 100° C. and 600° C. with an oxygen partial pressure of $10^{-5}$ to $10^{-8}$ millibar (mbar). In accordance with yet another embodiment of the invention, the thin silicon oxide can be grown by exposing the substrate to an ozone ambient at an elevated temperature in the same processing apparatus, such as a molecular beam epitaxial (MBE) reactor, used for the subsequent deposition of the accommodating buffer layer. Use of an ozone treatment to grow the oxide has the beneficial effect of removing carbon contamination from the surface of the substrate. In order to epitaxially grow a monocrystalline oxide layer overlying the monocrystalline substrate, the native and/or grown oxide layer must first be removed to expose the crystalline structure of the underlying substrate. The following process is preferably carried out by molecular beam epitaxy, although other epitaxial processes may also be used in accordance with the present invention. The native oxide can be removed by first depositing a thin layer (preferably 1–3 monolayers) of strontium, barium, a combination of strontium and barium, or other alkaline earth metals or combinations of alkaline earth metals onto the substrate in an MBE apparatus. In the case where strontium is used, the substrate is then heated to a temperature above 700° C. to cause the strontium to react with the native silicon oxide layer. The strontium serves to reduce the silicon oxide to leave a silicon oxide-free surface. The resultant surface may exhibit an ordered 2×1 structure. If an ordered (2×1) reconstruction has not been achieved at this stage of the process, the structure may be exposed to additional strontium until an ordered (2×1) reconstruction is obtained. The ordered 2×1 reconstruction forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkaline earth metal oxide, such as strontium oxide, strontium barium oxide, or barium oxide, onto the substrate surface by MBE at a low temperature and by subsequently heating the structure to a temperature of above 700° C. At this temperature a solid state reaction takes place between the strontium oxide and the native silicon oxide causing the reduction of the native silicon oxide and leaving an ordered 2×1 reconstruction on the substrate surface. If an ordered (2×1) reconstruction has not been achieved at this stage of the process, the structure may be exposed to additional strontium until an ordered (2×1) reconstruction is obtained. Again, this forms a template for the subsequent growth of an ordered monocrystalline oxide layer. In either method for removing the oxide layer and preparing the surface for the subsequent formation of a monocrystalline accommodating buffer layer, surface reconstruction can be monitored in real time, for example by using reflection high energy electron diffraction (RHEED). Other well known real time monitoring techniques may also be used.

Following the removal of the silicon oxide and formation of a template layer on the surface of the substrate, growth of a monocrystalline oxide layer on the substrate can begin. This growth is accomplished in the same apparatus, preferably an MBE reactor, as is the surface preparation. During the growth of the monocrystalline oxide layer overlying the monocrystalline silicon substrate, reactants, including oxygen, are introduced to the MBE reactor. Under proper conditions the reactants react at the silicon surface to grow the desired monocrystalline oxide. Because of the presence of the oxygen, however, a competing reaction, that of oxidizing the silicon substrate, can also occur. To achieve a high quality two dimensional growth of the monocrystalline oxide layer, the growth process should be controlled to suppress the competing reaction of the oxygen with the silicon substrate, a reaction that causes oxidation of the silicon substrate and disrupts the ordered two dimensional growth of the monocrystalline oxide layer. Although a layer of amorphous oxide underlying the monocrystalline oxide layer may be desirable for reducing strain in the monocrystalline oxide layer, that amorphous layer must be grown after the monocrystalline growth has been sufficiently initiated. In accordance with one embodiment of the invention, the ordered two dimensional growth of a high quality monocrystalline oxide layer, such as a layer of monocrystalline strontium titanate, overlying an oxidizable monocrystalline substrate, such as a silicon substrate, can be accomplished by the following process. The process suppresses the oxidation of the substrate material (i.e., in the case of a silicon substrate, oxidation of the silicon substrate to grow an amorphous silicon oxide layer) while allowing the oxidation of strontium and titanium to grow monocrystalline strontium titanate.

Following the removal of the silicon oxide layer from the substrate surface in a manner such as that described above, the substrate is cooled to a temperature between room temperature and about 400° C., and preferably to a temperature of about 300° C. The initial growth of the strontium titanate monocrystalline layer will take place at this lowered temperature. At the lowered temperature the oxidation of strontium and titanium to form strontium titanate is favored over the oxidation of the silicon substrate. The higher the temperature, the greater the oxidation rate of both the silicon oxide and the strontium titanate components. Similarly, the higher the partial pressure of oxygen in the reactor, the greater the oxidation rate of both the silicon substrate and the strontium titanate components strontium and titanium. However, the oxidation of strontium and titanium at low temperatures and at appropriate oxygen partial pressures is favored in contrast to the oxidation of silicon. Accordingly, to facilitate the growth of the strontium titanate in the most efficient manner, the temperature selected should be as high as possible without incurring deleterious amounts of silicon oxidation. Once the lowered temperature is stabilized, oxygen is introduced into the reactor to establish a partial pressure of oxygen in the reactor of between about $2 \times 10^{-8}$ mbar and about $3 \times 10^{-7}$ mbar. The exact pressure selected will depend on some physical parameters of the reactor such as the size of the reactor chamber and the reactor pumping capacity. The partial pressure selected should be high enough to grow stoichiometric strontium titanate but not too high to cause significant oxidation of Si. The strontium and titanium shutters of the MBE reactor are then opened to introduce strontium and titanium to the reaction. The ratio of strontium and titanium is adjusted to approximately 1:1 to grow stoichiometric strontium titanate. After about 1–3 monolayers of strontium titanate are grown on the silicon substrate surface the shutters are closed and the oxygen flow is terminated to reduce the oxygen partial pressure in the reactor chamber to less than about $5 \times 10^{-9}$ mbar. Under the above conditions the 1–3 monolayers of strontium titanate form on the silicon surface as an ordered two dimensional monocrystalline layer without significant oxidation of the silicon surface. Grown at 300° C., the order parameter of the strontium titanate layer is not high. That is, the film, although monocrystalline, is not of high crystalline quality. The temperature of the substrate is then raised to about 500–750° C. and preferably to about 650° C. to anneal the monocrystalline strontium titanate layer and to thereby improve the crystalline quality of the layer. At this elevated temperature the titanate layer becomes much more ordered. The ordering of the layer can be monitored in real time, preferably by observing RHEED patterns from the surface. The substrate is maintained at the elevated temperature until the intensity of the RHEED pattern begins to flatten out. This indicates that the ordering of the monocrystalline strontium titanate layer has saturated. The anneal at the elevated temperature, preferably less than 15 minutes, is terminated after the saturation is observed. Following the annealing process, the temperature of the substrate is again reduced and the growth process is initiated again. Because the silicon surface is not exposed, but is covered by the initial 1–3 monolayers of titanate, the growth temperature can be raised, for example to 400° C. Once the substrate reaches the lowered temperature, oxygen is again introduced into the reactor chamber and the partial pressure of oxygen is set to a value equal to or greater than the partial pressure maintained during the previous deposition. The titanium and strontium shutters are opened and an additional 1–3 monolayers of monocrystalline strontium titanate is grown overlying the silicon substrate. The additional strontium titanate can then be annealed, as above, to improve the crystallinity of the layer.

The steps of growth followed by anneal can be repeated to increase the thickness of the monocrystalline oxide layer. After a monocrystalline strontium titanate layer having a thickness greater than about 5 monolayers has been grown on the silicon substrate, the silicon substrate will be sufficiently isolated from the reactants and additional monocrystalline strontium titanate (if additional strontium titanate is necessary for the device structure being fabricated) can be grown at a higher temperature. For example, additional strontium titanate can be grown at a temperature between about 550° C. and about 950° C. and preferably at a temperature greater than about 650° C. Additionally, after the thickness of the monocrystalline strontium titanate layer exceeds about 10 monolayers, the partial pressure of oxygen can be increased above the initial minimum value to cause the growth of an amorphous silicon oxide layer at the interface between the monocrystalline silicon substrate and the monocrystalline strontium titanate layer. This silicon oxidation step may be applied either during or after the growth of the strontium titanate layer. The growth of the silicon oxide layer results from the diffusion of oxygen through the strontium titanate layer to the interface where the oxygen reacts with silicon at the surface of the underlying substrate. Strain that otherwise might exist in the strontium titanate layer because of the small mismatch in lattice constant between the silicon substrate and the growing crystal is relieved in the amorphous silicon oxide intermediate layer.

In the foregoing, a process has been disclosed for growing a high quality monocrystalline strontium titanate layer on a silicon substrate. Other monocrystalline oxides, and specifically metal oxides, can be grown on monocrystalline substrates in similar manner by oxidizing the metal without oxidizing the underlying substrate. This includes a series oxides such as $SrZrO_3$, $BaTiO_3$, $Pb(Zr, Ti)O_3$, $(Pb, La)(Zr, Ti)O_3$, $LaAlO_3$, $SrRuO_3$, YBCO, $CeO_2$, $ZrO_2$, and MgO etc. The principles of initiating growth at a low temperature to prevent the oxidization of the substrate and then anneal without the presence of the oxidant to improve the crystallinity at a small film thickness can be applied to any other oxides on any oxidizable substrates. In addition, the oxidants are not limited to oxygen but can be any other reactants that oxidize the substrate, such as $O_3$, $H_2O$, $N_2O$, $N_2$, $F_2$, $Cl_2$, etc. The monocrystalline oxide grown in this manner overlying a monocrystalline substrate can be used as a starting material for many device structures. For example, without going into great detail, a monocrystalline oxide such as strontium titanate may be used by itself as a high dielectric constant ("high k") insulator of a field effect transistor. In such a device a thin monocrystalline layer with a minimum of amorphous silicon oxide may be desired. Other field effect devices may be formed in which the strontium titanate layer is used as an accommodating buffer layer for the growth of a medium k dielectric such as monocrystalline strontium zirconate. Monocrystalline strontium zirconate is difficult to grow on monocrystalline silicon, but can be grown on strontium titanate by a MBE process or by a sol-gel process. The monocrystalline strontium titanate layer can also be used as an accommodating buffer layer for forming other monocrystalline insulator layers such as PZT, PLZT, conducting layers such as $SrRuO_3$, $(La, Sr)CoO_3$, superconducting layers such as YBCO, BSCCO, binary oxides such as MgO, $ZrO_2$, and even thick layers of strontium titanate. All of these can be formed on the monocrystalline strontium titanate by MBE, CBE, CVD, PVD, PLD, sol-gel process or by one of the other epitaxial growth processes described elsewhere in this disclosure. Other processes in which a monocrystalline accommodating buffer layer is formed on a monocrystalline substrate and a monocrystalline layer is formed on that accommodating buffer layer are described below in greater detail.

After the strontium titanate layer has been grown to the desired thickness, the monocrystalline strontium titanate may be capped by a template layer that is conducive to the subsequent growth of an epitaxial layer of a desired monocrystalline material. For example, for the subsequent growth of a monocrystalline compound semiconductor material layer of gallium arsenide, the MBE growth of the strontium titanate monocrystalline layer can be capped by terminating the growth with 0.5–2 monolayers of titanium, 0.5–2 monolayers of titanium-oxygen or with 0.5–2 monolayers of strontium-oxygen. Following the formation of this capping layer, arsenic is deposited to form a Ti—As bond, a Ti—O—As bond or a Sr—O—As bond. Any of these form an appropriate template for deposition and formation of a monocrystalline gallium arsenide layer. Following the formation of the template, gallium is subsequently introduced to the reaction with the arsenic to form gallium arsenide. Alternatively, gallium can be deposited on the capping layer to form a Sr—O—Ga bond, a Ti—Ga bond, or a Ti—O—Ga bond, and arsenic is subsequently introduced with the gallium to form the GaAs.

In accordance with a further embodiment of the invention, before growth of the GaAs layer, the template layer is enhanced by adding a wetting layer to the top thereof. Without the wetting layer, three dimensional growth of the compound semiconductor layer often occurs at the initial nucleation stage. The occurrence of three dimensional growth is due to low surface and interface energies associated with the oxide (in this example strontium titanate) surface. Oxides are typically chemically and energetically more stable than metals and most electronic materials such as GaAs. The three dimensional growth results in the spotty localized growth of discrete GaAs patches. Upon further growth the patches may grow together, but not as a monocrystalline layer. To achieve the desired two dimensional growth, a wetting layer is epitaxially grown on the upper surface of the accommodating buffer layer to raise the surface energy at the surface of the oxide layer. Useful wetting agents include materials having a cubic crystalline structure selected from the group of metals, intermetallics, and metal oxides. Representative materials meeting these criteria include NiAl, FeAl, CoAl, Ni, Co, Fe, Cu, Ag, Au, Ir, Rh, Pt, Pd, Rb, Cs, CoO, FeO, $Cu_2O$, $Rb_2O_3$, $Cs_2O_3$, and NiO. The selected wetting agent is deposited to a thickness of 0.5–5.0 monolayers on and as part of the template layer in the same process apparatus used for the deposition of the accommodating buffer layer. For example, if the accommodating buffer layer is strontium titanate, barium titanate, or barium strontium titanate and the desired monocrystalline compound semiconductor layer is GaAs or AlGaAs, 0.5–5.0 monolayers of NiAl form a suitable wetting layer. Preferably the deposition of the NiAl is initiated with the deposition of Ni.

Figure 6:
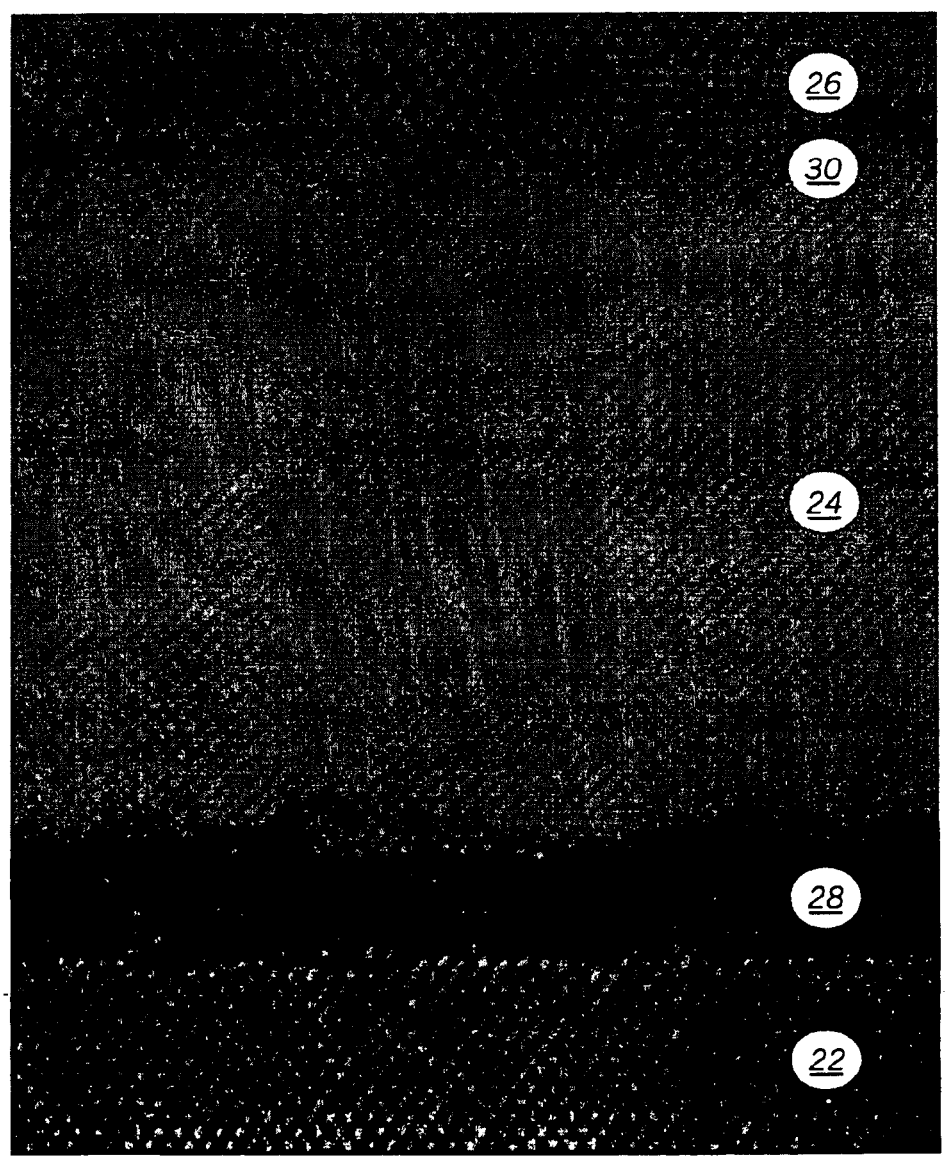
FIG. 6 illustrates a high resolution Transmission Electron Micrograph of a structure including a monocrystalline accommodating buffer layer.

FIG. 6 is a high resolution Transmission Electron Micrograph (TEM) of semiconductor material manufactured in accordance with one embodiment of the present invention. Single crystal $SrTiO_3$ accommodating buffer layer 24 was grown epitaxially on silicon substrate 22. During this growth process, amorphous interfacial layer 28 was formed which relieves strain due to lattice mismatch. GaAs compound semiconductor layer 26 was then grown epitaxially using template layer 30.

Figure 7:
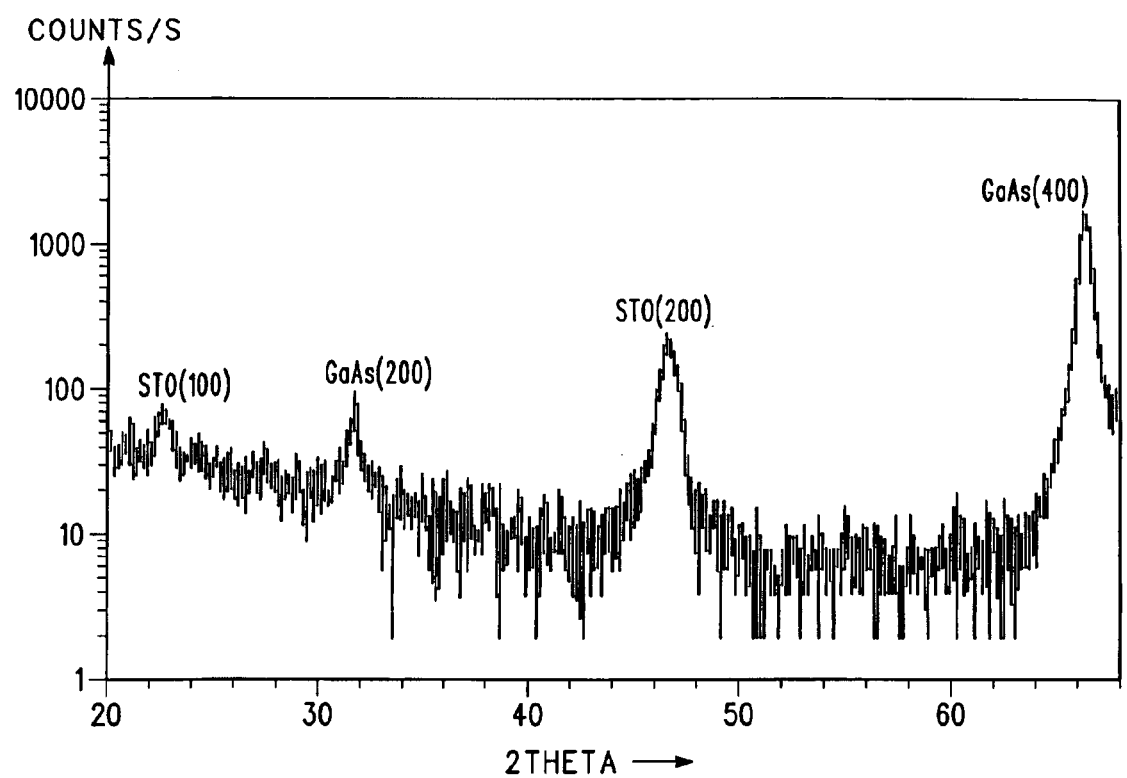
FIG. 7 illustrates an x-ray diffraction spectrum of a structure including a monocrystalline accommodating buffer layer.

FIG. 7 illustrates an x-ray diffraction spectrum taken on a structure including GaAs monocrystalline layer 26 grown on silicon substrate 22 using accommodating buffer layer 24. The peaks in the spectrum indicate that both accommodating buffer layer 24 and GaAs compound semiconductor layer 26 are single crystal and (100) orientated.

The structure illustrated in FIG. 2 can be formed by the process discussed above with the addition of an additional buffer layer deposition step. The additional buffer layer 32 is formed overlying the template layer before the deposition of the monocrystalline material layer. If the buffer layer is a monocrystalline material comprising a compound semiconductor superlattice, such a superlattice can be deposited, for example by MBE, on the template, including a wetting layer, as described above. If the buffer layer is a monocrystalline material layer comprising a layer of germanium, the process above is modified to cap the strontium titanate monocrystalline layer with a final layer of either strontium or titanium and then depositing a wetting layer formed of one of the wetting agents described above. The germanium buffer layer then can be deposited directly on this template/wetting layer.

Structure 34, illustrated in FIG. 4, may be formed by growing an accommodating buffer layer 24, forming an amorphous oxide layer 28 over substrate 22, and growing semiconductor layer 38 over the accommodating buffer layer, as described above. The accommodating buffer layer and the amorphous oxide layer are then exposed to an anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer, the amorphous oxide layer, and monocrystalline layer 38 to a rapid thermal anneal process with a peak temperature of about 700° C. to about 1000° C. and a process time of about 5 seconds to about 20 minutes. However, other suitable anneal processes may be employed to convert the accommodating buffer layer to an amorphous layer in accordance with the present invention. For example, laser annealing, electron beam annealing, or "conventional" thermal annealing processes (in the proper environment) may be used to form layer 36. When conventional thermal annealing is employed to form layer 36, an overpressure of one or more constituents of layer 38 may be required to prevent degradation of that layer during the anneal process. For example, when layer 38 includes GaAs, the anneal environment preferably includes an overpressure of arsenic to mitigate degradation of layer 38.

As noted above, layer 38 of structure 34 may include any materials suitable for either of layers 32 or 26. Accordingly, any deposition or growth methods described in connection with either layer 32 or 26, may be employed to deposit layer 38.

Figure 8:
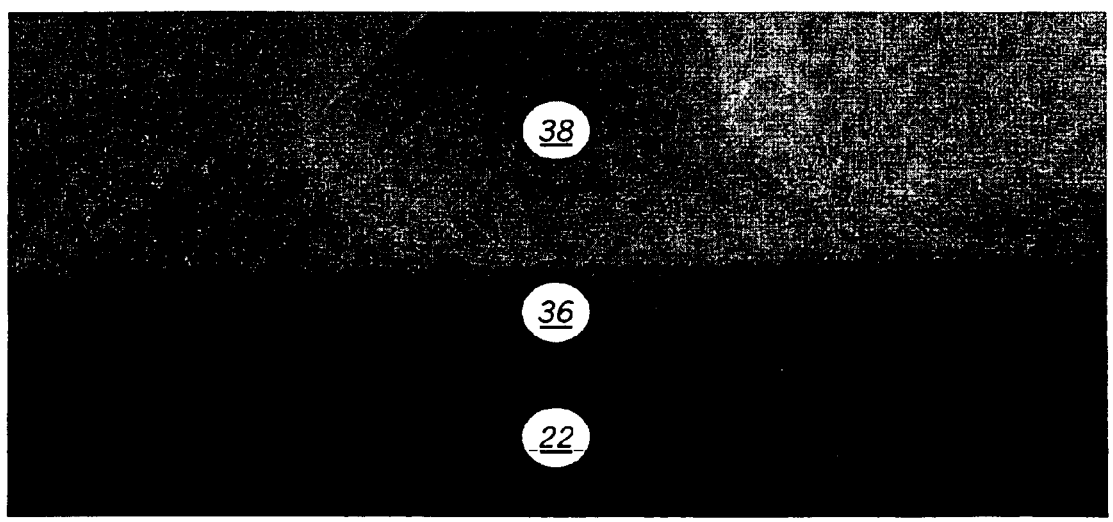
FIG. 8 illustrates a high resolution Transmission Electron Micrograph of a structure including an amorphous oxide layer.

FIG. 8 is a high resolution TEM of semiconductor material manufactured in accordance with the embodiment of the invention illustrated in FIG. 4. In accordance with this embodiment, a single crystal SrTiO$_3$ accommodating buffer layer was grown epitaxially on silicon substrate 22. During this growth process, an amorphous interfacial layer was formed as described above. Next, additional monocrystalline layer 38 comprising a compound semiconductor layer of GaAs was formed above the accommodating buffer layer and the accommodating buffer layer was exposed to an anneal process to form amorphous oxide layer 36.

Figure 9:
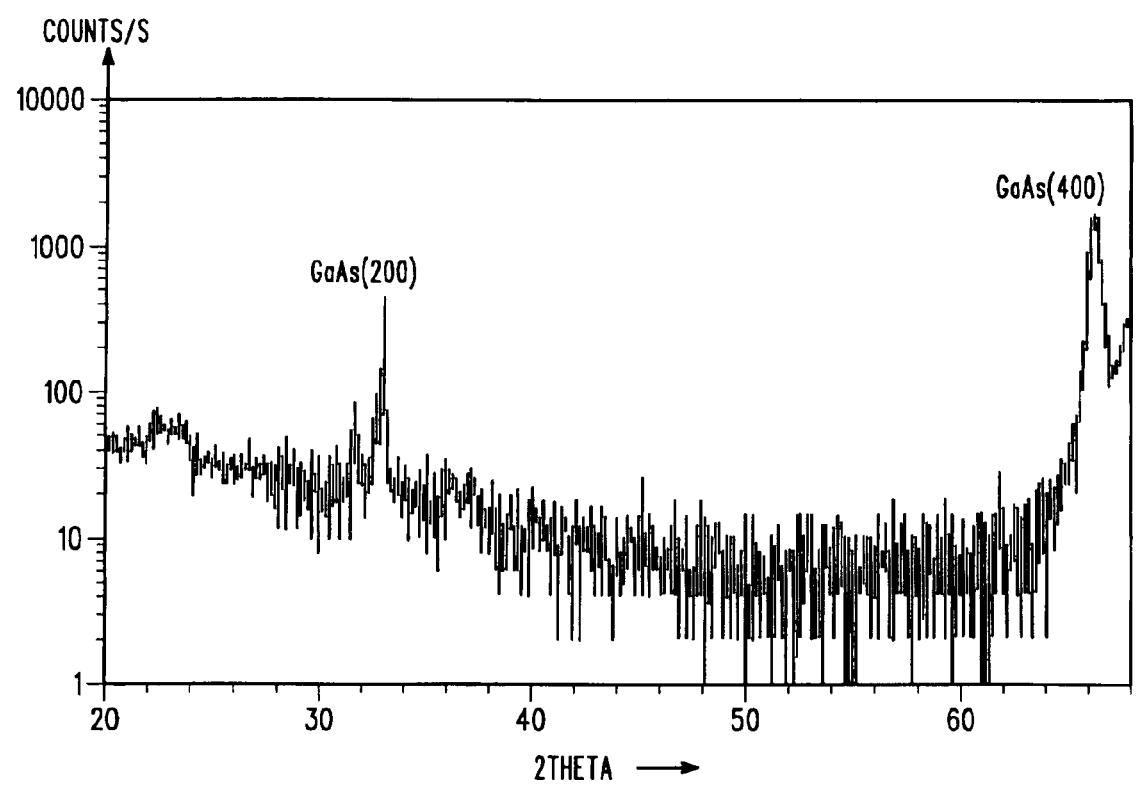
FIG. 9 illustrates an x-ray diffraction spectrum of a structure including an amorphous oxide layer.

FIG. 9 illustrates an x-ray diffraction spectrum taken on a structure including additional monocrystalline layer 38 comprising a GaAs compound semiconductor layer and amorphous oxide layer 36 formed on silicon substrate 22. The peaks in the spectrum indicate that GaAs compound semiconductor layer 38 is single crystal and (100) orientated and the lack of peaks around 40 to 50 degrees indicates that layer 36 is amorphous.

The process described above illustrates a process for forming a semiconductor structure including a silicon substrate, an overlying oxide layer, and a monocrystalline material layer comprising a gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, and niobates, alkaline earth metal tin-based perovskites, other perovskites, lanthanum aluminate, lanthanum scandium oxide, gadolinium oxide, and other metal oxides can also be grown. Further, by a similar process such as MBE, other monocrystalline material layers comprising other III–V, II–VI, and IV–VI monocrystalline compound semiconductors, semiconductors, metals and non-metals can be deposited overlying the monocrystalline oxide accommodating buffer layer.

Each of the variations of monocrystalline material layer and monocrystalline oxide accommodating buffer layer uses an appropriate template for initiating the growth of the monocrystalline material layer. For example, if the accommodating buffer layer is an alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide respectively. Similarly, if the monocrystalline oxide accommodating buffer layer is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer, respectively. In a similar manner, strontium titanate can be capped with a layer of strontium or strontium and oxygen and barium titanate can be capped with a layer of barium or barium and oxygen. Each of these depositions can be followed by the deposition of arsenic or phosphorus to react with the capping material to form a template for the deposition of a monocrystalline material layer comprising compound semiconductors such as indium gallium arsenide, indium aluminum arsenide, or indium phosphide. In each of the above examples, high quality two dimensional growth of the monocrystalline material layers overlying the monocrystalline oxide accommodating buffer layer can be promoted by incorporating an appropriate wetting layer into the template layer. The wetting layer, deposited to a thickness of 0.5–5.0 monolayers in the same apparatus used for the deposition or growth of the monocrystalline material layer, serves to alter the surface energy of the monocrystalline oxide. For example, if the accommodating buffer layer is SrTiO$_3$ and the monocrystalline material layer is GaAs, to maintain a true layer by layer growth (Frank Van der Merwe growth), the following relationship must be satisfied:

$$\delta_{STO} > (\delta_{INT} + \delta_{GaAs})$$

where the surface energy of the monocrystalline SrTiO$_3$ accommodating buffer oxide layer must be greater than the energy of the interface between the accommodating buffer layer and the GaAs layer added to the surface energy of the GaAs layer. A wetting layer, formed, for example from epitaxially grown NiAl, increases the surface energy of the monocrystalline oxide layer and also shifts the crystalline structure of the template to a diamond-like structure that is in compliance with the GaAs layer.

In this embodiment, a wetting agent containing template layer aids in the formation of a compliant substrate for the monolithic integration of various material layers including those comprised of Group III–V compounds to form high quality semiconductor structures, devices and integrated circuits. For example, a wetting agent containing template may be used for the monolithic integration of a monocrystalline material layer such as a layer comprising germanium to form high efficiency photocells.

Turning now to FIGS. 10–13, the formation of a device structure in accordance with still another embodiment of the invention is illustrated in cross-section. This embodiment utilizes the formation of a compliant substrate which relies on the epitaxial growth of single crystal oxides on silicon followed by the epitaxial growth of single crystal silicon onto the oxide.

Figure 10:
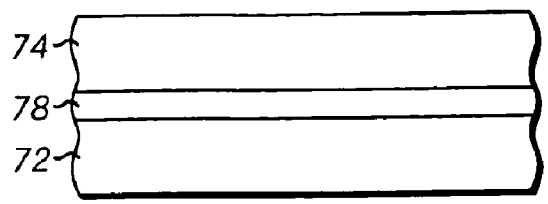
FIGS. 10–13 illustrate schematically, in cross-section, the formation of a device structure in accordance with another embodiment of the invention.

An accommodating buffer layer 74 such as a monocrystalline oxide layer is first grown on a substrate layer 72, such as silicon, with an amorphous interface layer 78 as illustrated in FIG. 10. Monocrystalline oxide layer 74 may be comprised of any of those materials previously discussed with reference to layer 24 in FIGS. 1–4, while amorphous interface layer 78 is preferably comprised of any of those materials previously described with reference to the layer 28 illustrated in FIGS. 1–4. Substrate 72, although preferably silicon, may also comprise any of those materials previously described with reference to substrate 22 in FIGS. 1–4.

Figure 11:

Next, a silicon layer 81 is deposited over monocrystalline oxide layer 74 via MBE, CVD, MOCVD, MEE, ALE, PVD, CSD, PLD, and the like as illustrated in FIG. 11 with a thickness of a few tens of nanometers but preferably with a thickness of about 5 nm. Monocrystalline oxide layer 74 preferably has a thickness of about 2 to 10 nm.

Figure 12:
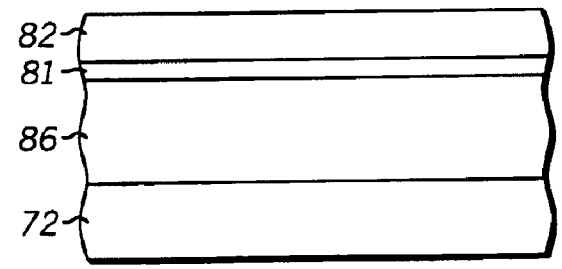

Rapid thermal annealing is then conducted in the presence of a carbon source such as acetylene or methane, for example at a temperature within a range of about 800° C. to 1000° C., to form capping layer 82 and amorphous silicate layer 86. Other suitable carbon sources may also be used. The purpose of the rapid thermal annealing step in the presence of a carbon source is to amorphize monocrystalline oxide layer 74 and to convert that monocrystalline layer into an amorphous silicate layer 86. The rapid thermal annealing also serves to carbonize the topmost portion of silicon layer 81 to form capping layer 82. The capping layer is a silicon carbide (SiC) layer as illustrated in FIG. 12. The formation of amorphous layer 86 is similar to the formation of layer 36 illustrated in FIG. 4 and may comprise any of those materials described with reference to layer 36 in FIG. 4.

Figure 13:
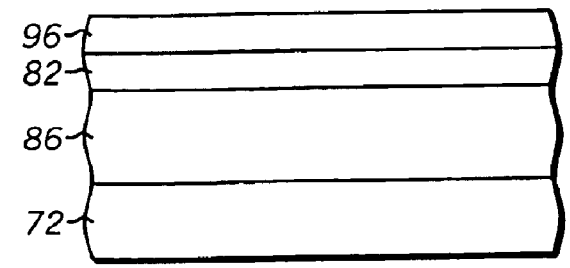

Finally, a compound semiconductor layer 96, such as gallium nitride (GaN) is grown over the SiC surface by MBE, CVD, MOCVD, MEE, ALE, PVD, CSD, PLD, or the like to form a high quality compound semiconductor material for device formation as illustrated in FIG. 13. More specifically, the deposition of GaN and GaN based systems such as GaInN and AlGaN will result in the formation of dislocation nets confined at the silicon/amorphous region. The resulting nitride containing compound semiconductor material may comprise elements from groups III, IV and V of the periodic table and is defect free.

Although GaN has been grown on SiC substrate in the past, this embodiment of the invention possesses a one step formation of the compliant substrate containing a SiC top surface and an amorphous layer on a Si surface. More specifically, this embodiment of the invention uses an intermediate single crystal oxide layer that is amorphized to form a silicate layer which adsorbs the strain between the layers. Moreover, unlike past use of a SiC substrate, this embodiment of the invention is not limited by wafer size which has usually been less than 50 mm in diameter for prior art SiC substrates.

The monolithic integration of nitride containing semiconductor compounds containing group III–V nitrides and silicon devices can be used for high temperature and high power RF applications and optoelectronics. GaN systems have particular use in the photonic industry for the blue/green and UV light sources and detection. High brightness light emitting diodes (LEDs) and lasers may also be formed within the GaN system.

Figure 14:
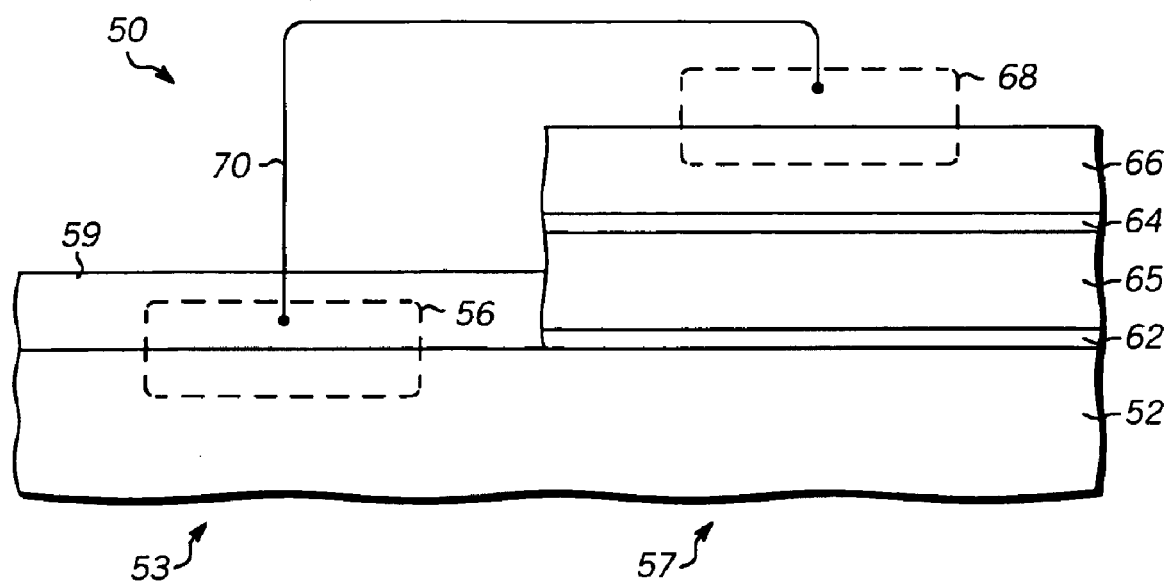
FIG. 14 illustrates schematically, in cross-section, the formation of a device structure in accordance with still another embodiment of the invention.

FIG. 14 illustrates schematically, in cross section, a device structure 50 in accordance with a further embodiment of the invention. Device structure 50 includes a monocrystalline semiconductor substrate 52, preferably a monocrystalline silicon wafer. In some applications substrate 52 may also include an epitaxial silicon layer 51. Monocrystalline semiconductor substrate 52 includes two regions, 53 and 57. An electrical semiconductor component generally indicated by the dashed line 56 is formed, at least partially, in region 53. Electrical component 56 can be a resistor, a capacitor, an active semiconductor component such as a diode or a transistor or an integrated circuit such as a CMOS integrated circuit. For example, electrical semiconductor component 56 can be a CMOS integrated circuit configured to perform digital signal processing or another function for which silicon integrated circuits are well suited. The electrical semiconductor component in region 53 can be formed by conventional semiconductor processing as well known and widely practiced in the semiconductor industry. A layer of insulating material 59 such as a layer of silicon dioxide or the like may overlie electrical semiconductor component 56.

Insulating material 59 and any other layers that may have been formed or deposited during the processing of semiconductor component 56 in region 53 are removed from the surface of region 57 to provide a bare silicon surface in that region. As previously explained, bare silicon surfaces are highly reactive and a native silicon oxide layer can quickly form on the bare surface. A layer of barium or barium and oxygen is deposited onto the native oxide layer on the surface of region 57 and is reacted with the oxidized surface to reduce the native oxide and to form a first template layer (not shown). In accordance with one embodiment, a monocrystalline oxide layer 65 is formed overlying the template layer by a process of molecular beam epitaxy. Reactants including barium, titanium and oxygen are reacted on the template layer to form a monocrystalline barium titanante layer in a manner similar to that discussed in detail above. After a suitable layer of monocrystalline oxide is formed, the partial pressure of oxygen in the MBE reactor chamber is then increased to provide an overpressure of oxygen and to allow oxygen to diffuse through the growing monocrystalline oxide layer. The oxygen diffusing through the barium titanate layer reacts with silicon at the surface of region 57 to form an amorphous layer of silicon oxide 62 on second region 57 at the interface between silicon substrate 52 and monocrystalline oxide layer 65. Layers 65 and 62 may be subject to an annealing process as described above in connection with FIG. 4 to form a single amorphous accommodating layer.

In accordance with an embodiment of the invention, the step of depositing monocrystalline oxide layer 65 is terminated by depositing a second template layer 64, which can be 0.5–10 monolayers of titanium, barium, barium and oxygen, or titanium and oxygen. A layer 66 of a monocrystalline compound semiconductor material is then deposited overlying second template layer 64 by a process of molecular beam epitaxy in a manner similar to that described in detail above. The deposition of layer 66 is initiated by depositing a layer of arsenic onto template 64. This initial step is followed by depositing gallium and arsenic to form monocrystalline gallium arsenide 66. Alternatively, strontium can be substituted for barium in the above example.

In accordance with a further embodiment, a semiconductor component, generally indicated by a dashed line 68, is formed in compound semiconductor layer 66. Semiconductor component 68 can be formed by processing steps conventionally used in the fabrication of gallium arsenide or other III–V compound semiconductor material devices. Semiconductor component 68 can be any active or passive component, and preferably is a semiconductor laser, light emitting diode, photodetector, heterojunction bipolar transistor (HBT), high frequency MESFET, or other component that utilizes and takes advantage of the physical properties of compound semiconductor materials. A metallic conductor schematically indicated by the line 70 can be formed to electrically couple device 68 and device 56, thus implementing an integrated device that includes at least one component formed in silicon substrate 52 and one device formed in monocrystalline compound semiconductor material layer 66. Although illustrative structure 50 has been described as a structure formed on a silicon substrate 52 and having a barium (or strontium) titanate layer 65 and a gallium arsenide layer 66, similar devices can be fabricated using other substrates, other monocrystalline oxide layers and other compound semiconductor layers as described elsewhere in this disclosure.

Clearly, those embodiments specifically describing structures having compound semiconductor portions and Group IV semiconductor portions, are meant to illustrate embodiments of the present invention and not to limit the present invention. There are a multiplicity of other combinations and other embodiments of the present invention. For example, the present invention includes structures and methods for fabricating material layers which form semiconductor structures, devices and integrated circuits including other layers such as metal and non-metal layers. More specifically, the invention includes structures and methods for forming a compliant substrate which is used in the fabrication of semiconductor structures, devices and integrated circuits and the material layers suitable for fabricating those structures, devices, and integrated circuits. By using embodiments of the present invention, it is now simpler to integrate devices that include monocrystalline layers comprising semiconductor and compound semiconductor materials as well as other material layers that are used to form those devices with other components that work better or are easily and/or inexpensively formed within semiconductor or compound semiconductor materials. This allows the size of a device to be reduced, the manufacturing costs to decrease, and yield and reliability to increase.

In accordance with one embodiment of this invention, a monocrystalline semiconductor or compound semiconductor wafer can be used in forming monocrystalline material layers over the wafer. In this manner, the wafer is essentially a "handle" wafer used during the fabrication of semiconductor electrical components within a monocrystalline layer overlying the wafer. Therefore, electrical components can be formed within semiconductor material layers formed over large diameter wafers such as wafers having diameters of 200 millimeters or more.

By the use of this type of substrate, a relatively inexpensive "handle" wafer overcomes the fragile nature of compound semiconductor or other monocrystalline material wafers by placing them over a relatively more durable and easy to fabricate base material. Therefore, an integrated circuit can be formed such that all electrical components, and particularly all active electronic devices, can be formed within or using the monocrystalline material layer even though the substrate itself may include a monocrystalline semiconductor material. Fabrication costs for compound semiconductor devices and other devices employing non-silicon monocrystalline materials should decrease because larger substrates can be processed more economically and more readily compared to the relatively smaller and more fragile substrates (e.g. conventional compound semiconductor wafers).

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications and changes are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A method for growing a monocrystalline oxide layer on a monocrystalline substrate comprising:

positioning a monocrystalline substrate having a surface within a reaction chamber;

removing any oxide that may be present on the surface of the substrate;

heating the substrate to a first temperature;

introducing oxygen to the reaction chamber to establish a first partial pressure of to oxygen in the reaction chamber, where the chosen combination of said first temperature and said first partial pressure is such that the substrate will not substantially react with the oxygen;

introducing at least one reactant to the reaction chamber and reacting the at least one reactant and the oxygen to form a first layer of oxide;

stopping the introduction of said at least one reactant to the reaction chamber;

reducing the partial pressure of oxygen in the reaction chamber to a second partial pressure of oxygen less than the first partial pressure of oxygen; and heating the substrate to a second temperature greater than the first temperature, where the second temperature is high enough to improve the crystalline quality of the first layer, and the second temperature is not so high as to cause the substrate to react with the first layer.

2. The method of claim 1 further comprising:

after heating the substrate to a second temperature, lowering the temperature of the substrate to a third temperature less than the second temperature;

introducing oxygen to the reaction chamber to establish a third partial pressure of oxygen in the reaction chamber, the third partial pressure of oxygen equal to or greater than the second partial pressure of oxygen;

again introducing at least one reactant to the reaction chamber and reacting the at least one reactant and the oxygen to form a second layer of oxide overlying the first layer;

stopping again introducing said at least one reactant to the reaction chamber;

reducing the partial pressure of oxygen in the reaction chamber to a fourth partial pressure of oxygen less than or equal to the third partial pressure of oxygen; and heating the substrate to a fourth temperature greater than the third temperature, where the fourth temperature is high enough to improve the crystalline quality of the second layer.

3. The method of claim 2 further comprising forming a template overlying the second layer.

4. The method of claim 3 further comprising forming a third monocrystalline layer overlying the second layer.

5. The method of claim 4 wherein forming a third monocrystalline layer comprises forming a monocrystalline layer of semiconductor material, compound semiconductor material, oxide material, metal or non-metal material.

6. The method of claim 2 further comprising forming a layer of gate electrode material overlying the second layer.

7. The method of claim 1 wherein the monocrystalline substrate is a monocrystalline silicon substrate.

8. The method of claim 7 further comprising:

after heating the substrate to a second temperature, heating the substrate in an oxygen ambient to form an amorphous layer of silicon oxide between the monocrystalline silicon substrate and the first layer.

9. The method of claim 7 wherein introducing at least one reactant comprises introducing constituent elements of perovskite oxides.

10. The method of claim 7 wherein introducing at least one reactant comprises introducing an alkaline earth metal and a transition metal to the reaction chamber.

11. The method of claim 10 wherein introducing at least one reactant comprises introducing strontium and titanium to the reaction chamber.

12. The method of claim 1 wherein removing any oxide comprises depositing an alkaline earth metal overlying the any oxide and reacting the alkaline earth metal with the any oxide to reduce the any oxide.

13. The method of claim 12 further comprising depositing additional alkaline earth metal onto the surface of the monocrystalline substrate after reacting the alkaline earth metal with the any oxide to reduce the any oxide.

14. The method of claim 1 further comprising monitoring the first layer of oxide using RHEED during heating the substrate to a second temperature.

15. The method of claim 11 wherein heating the substrate to a first temperature comprises heating the substrate to a temperature less than 400° C.

16. The method of claim 15 wherein heating the substrate to a first temperature comprises heating the substrate to a temperature of about 300° C.

17. The method of claim 15 wherein heating the substrate to a second temperature comprises heating the substrate to a temperature between 600° C. and 750° C.

18. The method of claim 17 where the first layer has a thickness of about 1–15 angstroms.

19. The method of claim 1 further comprising forming a second monocrystalline layer overlying the first layer.

20. The method of claim 19 wherein forming a second monocrystalline layer comprises forming a monocrystalline layer of material selected from the group consisting of semiconductor material, compound semiconductor material, oxide material, metal and non-metal material.

21. The method of claim 1 further comprising forming a layer of gate electrode material overlying the first layer.

22. A method for fabricating a semiconductor structure comprising:

provisioning an oxidizable monocrystalline substrate having a surface within a reaction chamber;

removing any oxide that may be present on the surface of the substrate;

heating the substrate to a first temperature;

introducing oxygen to the reaction chamber to establish a partial pressure of oxygen in the reaction chamber;

introducing at least one reactant to the reaction chamber;

reacting the oxygen and the at least one reactant at the surface of the substrate to grow an oxide on the surface;

decreasing the partial pressure of oxygen in the reaction chamber;

terminating introducing a metal reactant; and heating the substrate to a second temperature greater than the first temperature to improve the crystalline quality of the oxide;

wherein the first temperature is a temperature at which oxidation of the at least one reactant is kinetically favored in comparison to oxidation of the oxidizable substrate.

23. A process for fabricating a semiconductor structure comprising:

providing a monocrystalline silicon substrate; and depositing a monocrystalline perovskite oxide film overlying the monocrystalline silicon substrate, comprising:

placing the substrate in a reactor chamber;

removing any oxide that may be present on the surface of the substrate;

heating the substrate to a temperature less than about 400° C.;

introducing oxygen and a plurality of metal reactants to the reactor chamber to grow about 1–15 angstroms of a first layer of perovskite oxide on the substrate;

heating the substrate to a second temperature between about 600° C. and about 750° C. to improve the crystalline quality of the perovskite oxide.

24. The process of claim 23 further comprising forming a second layer overlying the monocrystalline perovskite oxide film.

25. The process of claim 24 wherein forming a second layer comprises epitaxially forming a monocrystalline layer of material selected from the group consisting of semiconductor material, compound semiconductor material, oxide material, metal and non-metal material.

* * * * *

UNITED STATES PATENT AND TRADEMARK OFFICE
CERTIFICATE OF CORRECTION

PATENT NO. : 6,916,717 B2 Page 1 of 1
APPLICATION NO. : 10/137383
DATED : July 12, 2005
INVENTOR(S) : Hao Li It is certified that error appears in the above-identified patent and that said Letters Patent is hereby corrected as shown below:

In Column 22, Line 10, Claim No. 1:

Change "of to oxygen" to --of oxygen--

Signed and Sealed this

Twentieth Day of February, 2007

JON W. DUDAS
*Director of the United States Patent and Trademark Office*